US009870819B2

(12) United States Patent
Shiimoto

(10) Patent No.: US 9,870,819 B2
(45) Date of Patent: *Jan. 16, 2018

(54) SEMICONDUCTOR DEVICE AND INFORMATION READING METHOD

(71) Applicant: Sony Semicondudor Solutions Corporation, Kanagawa (JP)

(72) Inventor: Tsunenori Shiimoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/356,045

(22) Filed: Nov. 18, 2016

(65) Prior Publication Data

US 2017/0069376 A1   Mar. 9, 2017

Related U.S. Application Data

(63) Continuation of application No. 14/934,630, filed on Nov. 6, 2015, now Pat. No. 9,548,112, which is a
(Continued)

(30) Foreign Application Priority Data

Mar. 6, 2013 (JP) .................................. 2013-044173

(51) Int. Cl.
*G11C 11/00* (2006.01)
*G11C 13/00* (2006.01)
(Continued)

(52) U.S. Cl.
CPC ........ *G11C 13/0033* (2013.01); *G11C 13/004* (2013.01); *G11C 13/0061* (2013.01);
(Continued)

(58) Field of Classification Search
CPC .................................................. G11C 13/0002
(Continued)

(56) References Cited

U.S. PATENT DOCUMENTS 9,208,872 B2 * 12/2015 Shiimoto ............. G11C 13/004
9,548,112 B2 *  1/2017 Shiimoto ............. G11C 13/004
(Continued)

FOREIGN PATENT DOCUMENTS

CN      1841558      10/2006
CN     102637454      8/2012
(Continued)

OTHER PUBLICATIONS

Aratani, K., et al., "A Novel Resistance Memory with High Scalability and Nanosecond Switching", Solid State Memories Research Laboratory, IEEE 2007, pp. 783-786.
(Continued)

*Primary Examiner* — Hoai V Ho
(74) *Attorney, Agent, or Firm* — Dentons US LLP

(57) ABSTRACT

A semiconductor device including a memory device configured to take a plurality of resistance states that are distinguishable from one another; a bias application section configured to apply, in a bias application period, a bias signal to the memory device; and a determination section configured to determine a resistance state of the memory device on the basis of a detection signal, in which the detection signal is generated in the memory device to which the bias signal is applied. The bias application section sets a length of the bias application period in accordance with a resistance value of the memory device, when the resistance state determined by the determination section is predetermined one of the resistance states.

18 Claims, 18 Drawing Sheets

Related U.S. Application Data continuation of application No. 14/189,400, filed on Feb. 25, 2014, now Pat. No. 9,208,872.

(51) Int. Cl.
 *H01L 27/24* (2006.01)
 *H01L 45/00* (2006.01)
(52) U.S. Cl.
 CPC ........ *H01L 27/2436* (2013.01); *H01L 45/141* (2013.01); *G11C 2013/0045* (2013.01); *G11C 2013/0052* (2013.01); *G11C 2013/0054* (2013.01); *G11C 2213/11* (2013.01); *G11C 2213/79* (2013.01)
(58) Field of Classification Search
 USPC ........................................................ 365/148
 See application file for complete search history.

(56) References Cited

U.S. PATENT DOCUMENTS

| | | | |
|---|---|---|---|
| 2006/0227592 A1 | 10/2006 | Parkinson | |
| 2011/0110144 A1* | 5/2011 | Kawai | G11C 11/5685 365/148 |
| 2011/0280059 A1* | 11/2011 | Xiao | G11C 13/0007 365/148 |
| 2012/0008370 A1* | 1/2012 | Yasuda | H01L 27/2436 365/148 |
| 2012/0020141 A1* | 1/2012 | Kitagawa | G11C 13/0009 365/148 |
| 2012/0069633 A1* | 3/2012 | Katoh | G11C 13/004 365/148 |
| 2012/0212994 A1* | 8/2012 | Tsushima | H01L 27/101 365/148 |

FOREIGN PATENT DOCUMENTS

| | | |
|---|---|---|
| JP | 2003-323791 | 11/2003 |
| JP | 2012-169011 | 9/2012 |

OTHER PUBLICATIONS

Japanese Office Examination Report issued in connection with related Japanese Patent Application No. JP 2013-044173 dated Aug. 4, 2015.

Chinese Office Action corresponding to Chinese Appl. No. 201410035029.3 dated Feb. 28, 2017.

\* cited by examiner

SEMICONDUCTOR DEVICE AND INFORMATION READING METHOD

CROSS REFERENCE TO RELATED APPLICATIONS

This application is a continuation of U.S. patent application Ser. No. 14/934,630 filed Nov. 6, 2015, which is a continuation of U.S. patent application Ser. No. 14/189,400 filed Feb. 25, 2014, now U.S. Pat. No. 9,208,872 issued Dec. 8, 2015, the entireties of which are incorporated herein by reference to the extent permitted by law. This application claims the benefit of Japanese Priority Patent Application JP 2013-044173 filed Mar. 6, 2013, the entire contents of which are incorporated herein by reference.

BACKGROUND

The present disclosure relates to a semiconductor device that includes a memory device configured to store information by utilizing a characteristic that a resistance value is changed, and a method of reading information from such a semiconductor device.

In information appliances such as computers and so forth, DRAM (Dynamic Random Access Memory) which is high in density and operates at a high speed is widely used as a random access memory. However, since the DRAM is complicated in manufacturing process in comparison with a general logic circuit LSI (Large Scale Integrated Circuit) and signal processing used in an electronic appliance, the manufacturing cost is increased. In addition, the DRAM is a volatile memory that information is lost when its power source is turned off and it is necessary to frequently perform a refreshing operation, that is, operations of reading out, amplifying again and rewriting again written information (data).

On the other hand, nowadays a non-volatile memory that information is not lost even when its power source is turned off is frequently used. Since such a non-volatile memory is free from execution of the refreshing operation, a reduction in power consumption is expected. Although various types of memory devices are developed as the memory device used in such a non-volatile memory, there is, as one of them, a so-called variable-resistance memory device that stores information utilizing the characteristic that its resistance value is changed (see, for example, K. Aratani, K. Ohba, T. Mizuguchi, S. Yasuda, T. Shiimoto, T. Tsushima, T. Sone, K. Endo, A. Kouchiyama, S. Sasaki, A. Maesaka, N. Yamada, and H. Narisawa, "A Novel Resistance Memory with High Scalability and Nanosecond Switching", Technical Digest IEDM 2007, 783-786).

Various methods are proposed as a method of reading out information stored in such a variable-resistance memory device. For example, Unexamined Patent Application Publication No. 2003-323791 discloses an information storage unit in which information is read out by applying a bias voltage to a memory device and detecting a current flowing in the memory device with the bias voltage.

SUMMARY

In general, so-called read disturb in which, due to the reading operation, a memory state in the memory device is inverted or it becomes difficult to rewrite the information may possibly occur in the non-volatile memory, and a non-volatile memory in which such read disturb is difficult to occur is desired.

It is desirable to provide a semiconductor device and an information reading method that make the read disturb difficult to occur.

According to an embodiment of the present disclosure, there is provided a semiconductor device including: a memory device configured to take a plurality of resistance states that are distinguishable from one another; a bias application section configured to apply, in a bias application period, a bias signal to the memory device; and a determination section configured to determine a resistance state of the memory device on the basis of a detection signal, the detection signal being generated in the memory device to which the bias signal is applied. The bias application section sets a length of the bias application period in accordance with a resistance value of the memory device, when the resistance state determined by the determination section is predetermined one of the resistance states.

According to an embodiment of the present disclosure, there is provided an information reading method including: applying, in a bias application period, a bias signal to a memory device configured to take a plurality of resistance states that are distinguishable from one another; determining a resistance state of the memory device on the basis of a detection signal, the detection signal being generated in the memory device to which the bias signal is applied; and setting a length of the bias application period in accordance with a resistance value of the memory device, when the determined resistance state is predetermined one of the resistance states.

In the semiconductor device and the information reading method according to the above-described embodiments of the present disclosure, the bias signal is applied in the bias application period to the memory device, the detection signal is generated in the memory device, and the resistance state of the memory device is determined on the basis of the detection signal. In the above-mentioned case, the length of the bias application period is set in accordance with the resistance value of the memory device, when the determined resistance state is predetermined one of the resistance states.

In the semiconductor device and the information reading method according to the above-described embodiments of the present disclosure, since the length of the bias application period is set in accordance with the resistance value of the memory device when the decided state is predetermined one of the resistance states in the plurality of resistance states, it is possible to make the read disturb difficult to occur.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, some embodiments of the present disclosure will be described in detail with reference to the accompanying drawings.
<Embodiments>

CONFIGURATION EXAMPLES

General Configuration Example

Figure 1:
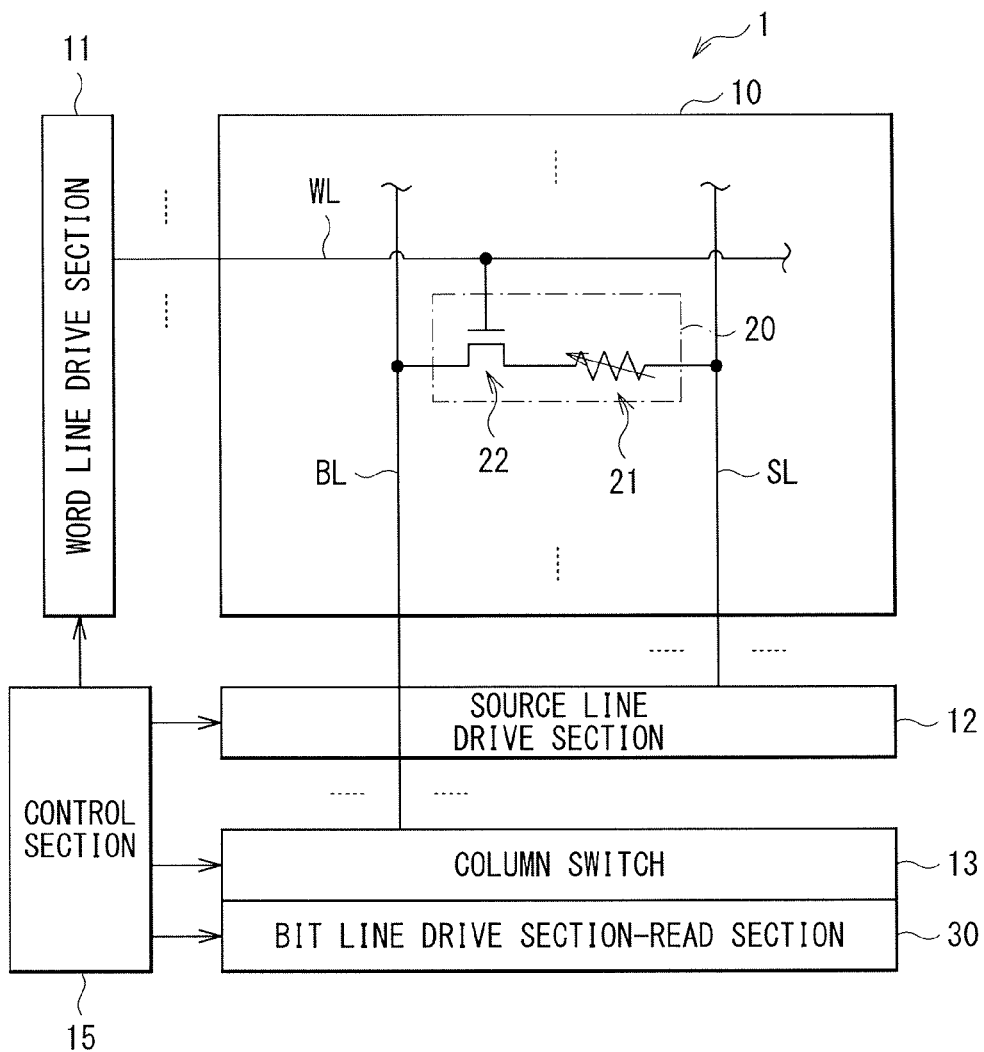
FIG. 1 is a block diagram illustrating one configuration example of a semiconductor device according to an embodiment of the present disclosure.

FIG. 1 illustrates one configuration example of a semiconductor device according to an embodiment of the present disclosure. A semiconductor device 1 is a storage that includes a variable-resistance memory device. It is to be noted that since an information reading method according to an embodiment of the present disclosure is embodied by the present embodiment, description thereof will be made together.

The semiconductor device 1 includes a memory cell array 10, a word line drive section 11, a source line drive section 12, a column switch 13, a bit line drive section-read section 30, and a control section 15.

The memory cell array 10 includes a plurality of memory cells 20 that are arranged in a matrix. In addition, the memory cell array 10 includes a plurality of word lines WL extending in a row direction (a lateral direction), and a plurality of bit lines BL and a plurality of source lines SL both extending in a column direction (a longitudinal direction). One end of each word line WL is connected to the word line drive section 11, one end of each bit line BL is connected to the bit line drive section-read section 30 via the column switch 13, and one end of each source line SL is connected to the source line drive section 12. In addition, the memory cell array 10 also includes a not illustrated reference memory cell 29.

The memory cell 20 includes a memory device 21 and a selection transistor 22. Each memory cell 20 is connected to the word line WL, the bit line BL, and the source line SL.

The memory device 21 is a device that stores information by utilizing that its resistance state is reversibly changed in accordance with a polarity of a difference in potential applied across both ends thereof. This memory device 21 has two distinguishable resistance states (a low resistance state LRS and a high resistance state HRS). One end of the memory device 21 is connected with the selection transistor 22, and the other end thereof is connected to the source line SL.

The selection transistor 22 is a transistor for selecting the memory device 21 to be driven and may be configured by, for example, a MOS (Metal Oxide Semiconductor). However, a transistor of another structure may be used without limitation to the above. A gate of the selection transistor 22 is connected to the word line WL, and one of a source and a drain thereof is connected to one end of the memory device 21 and the other is connected to the bit line BL.

Figure 2:
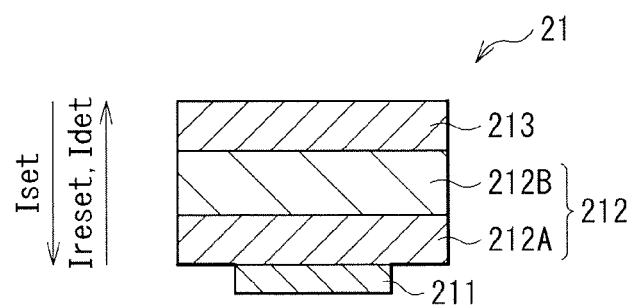
FIG. 2 is a sectional diagram illustrating one example of a schematic sectional structure of a memory device illustrated in FIG. 1.

FIG. 2 illustrates one example of a schematic sectional structure of the memory device 21. The memory device 21 is of the type that a lower electrode 211, a memory layer 212, and an upper electrode 213 are laminated in this order.

The lower electrode 211 is an electrode disposed on one end side of the memory device 21 and is connected to the selection transistor 22. This lower electrode 211 may be made of a wiring material used in a semiconductor process, for example, a metal and/or a metal nitride such as tungsten (W) and/or, a tungsten nitride (WN), a titanium nitride (TiN), a tantalum nitride (TaN) and so forth. However, the constituent materials of the lower electrode 211 are not limited to them.

The memory layer 212 has a laminate structure including an ion source layer 212B disposed on the upper electrode 213 side and a resistance change layer 212A disposed on the lower electrode 212 side. The memory layer 212 is configured such that a resistance state thereof is reversibly changed in accordance with the polarity of the difference in potential applied across the lower electrode 211 and the upper electrode 213 as described later.

The ion source layer 212B contains one or more kinds of chalcogen elements including tellurium (Te), sulfur (S), and selenium (Se) as ion conduction materials to be negatively ionized. In addition, the ion source layer 212B contains one or more of zirconium (Zr), hafnium (Hf), and copper (Cu) as positively ionizable metal elements, and one or both of aluminum (Al) and germanium (Ge) as elements forming an oxide when erasing. Specifically, the ion source layer 212B may be made of an ion source layer material having a composition or compositions such as, for example, ZrTeAl, ZrTeAlGe, CuZrTeAl, CuTeGe, CuSiGe and so forth. Incidentally, the ion source layer 212B may contain elements other than the above such as, for example, silicon (Si), boron (B) and so forth.

The resistance change layer 212A has a function of stabilizing information retention characteristics as a barrier in electric conduction and is made of a material which is higher in resistance value than the ion source layer 212B. Examples of the constituent materials of the resistance change layer 212A may include, preferably, rare-earth elements such as gadolinium (Gd) and so forth, and oxides, nitrides and so forth containing one or more kinds of aluminum (Al), magnesium (Mg), tantalum (Ta), silicon (Si), and copper (Cu).

The upper electrode 213 is an electrode disposed on the other end side of the memory device 21 and is connected to the source line SL. The upper electrode 213 may be made of a known semiconductor wiring material similarly to the lower electrode 211. In such materials, a stable material that does not react with the ion source layer 212B even after post-annealed may be preferable, in particular.

Although the configuration of the memory cell 20 has been described as mentioned above, the reference memory cell 29 has the similar configuration. However, a memory device in the reference memory cell 29 has a resistance value that is between resistance values of the two resistance states (the low resistance state LRS and the high resistance state HRS) of the memory device 21 in the memory cell 20. Specifically, for example, a resistance value in the low resistance state LRS may be about 100 [kΩ], a resistance value in the high resistance state HRS may be about 1 [MΩ], and a resistance value of the reference memory cell 29 may be about 300 [kΩ].

The word line drive section 11 selects the memory cell 20 to be driven in the memory cell array 10 on the basis of a control signal supplied from the control section 15. Specifically, the word line drive section 11 selects a row that the memory cell 20 to be subjected to a data writing operation or a data reading operation belongs by applying a signal to the word line WL of the memory cell array 10.

The source line drive section 12 applies a voltage to the other end (the upper electrode 213) of the memory device 21 of the memory cell 20 that has been selected to be driven on the basis of the control signal supplied from the control section 15. Specifically, the source line drive section 12 applies the voltage to the memory device 21 to be subjected to the data writing operation or the data reading operation by applying a signal to the source line SL of the memory cell array 10. In the above-mentioned case, in the data writing operation, the source line drive section 12 applies the voltage to the source line SL such that the potential difference between the lower electrode 211 and the upper electrode 213 exhibits the polarity according to that data similarly to a bit line drive section 30A (described later). In addition, in the data reading operation, the source line drive section 12 applies a voltage Vss (0V in this example) to the source line SL that is connected to the memory cell 20 to be subjected to the data writing operation.

The column switch 13 connects the bit line BL pertaining to the memory cell 20 to be driven in the plurality of bit lines BL of the memory cell array 10 with the bit line drive section-read section 30 on the basis of a control signal supplied from the control section 15.

The bit line drive section-read section 30 selectively performs the data writing operation or the data reading operation on the memory cell 20 that has been selected to be driven via the column switch 13 and the bit line BL on the basis of a control signal supplied from the control section 15. The bit line drive section-read section 30 includes the bit line drive section 30A and a plurality of read sections 30B. In the data writing operation, the bit line drive section 30A applies a voltage to the bit line BL such that the potential difference between the lower electrode 211 and the upper electrode 213 exhibits the polarity according to that data similarly to the source line drive section 12. In addition, in the data reading operation, the read section 30B applies a bias voltage Vbias to the bit line BL, and reads out the data on the basis of a detection current Idet generated in the memory device 21 with that bias voltage Vbias.

The control section 15 is a circuit for supplying the control signals to the word line drive section 11, the source line drive section 12, the column switch 13, and the bit line drive section-read section 30 to control such that these sections operate in synchronization with one another.

Figure 3A:
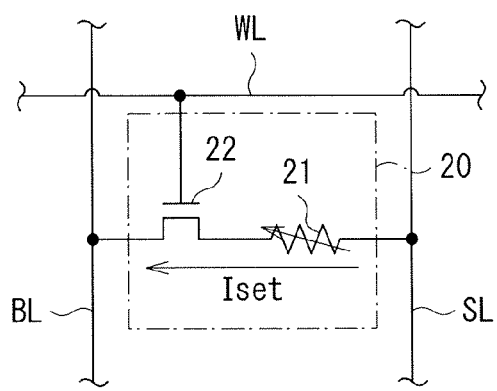
FIG. 3A is a schematic diagram illustrating one example of a flowing direction of a set current in a memory cell illustrated in FIG. 1.
Figure 3B:
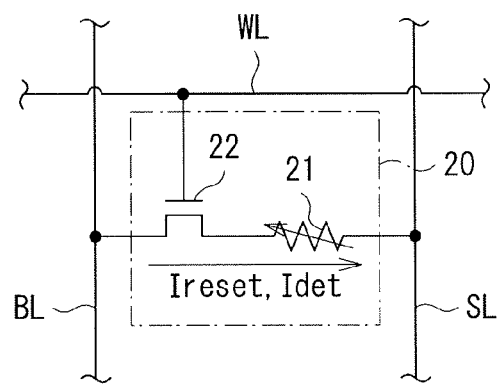
FIG. 3B is a schematic diagram illustrating one example of flowing directions of a reset current and a detection current in the memory cell illustrated in FIG. 1.

FIGS. 3A and 3B illustrate examples of current directions in the memory cell 20 when performing the data writing operation and the data reading operation.

When the data writing operation is to be performed, a case of bringing (setting) the memory device 21 to the low resistance state LRS and a case of bringing (resetting) the memory device 21 to the high resistance state HRS are different from each other in current flowing direction. That is, when the memory device 21 is to be brought to the low resistance state LRS, the source line drive section 12 and the bit drive section 30A set the voltage of the source line SL to be higher than the voltage of the bit line BL. Thus, in the memory cell 20, a set current Iset flows from the memory device 21 toward the selection transistor 22 as illustrated in FIG. 3A. At that time, in the memory device 21, the set current Iset flows from the upper electrode 213 toward the lower electrode 211 (FIG. 2). On the other hand, when the memory device 21 is to be brought to the high resistance state HRS, the source line drive section 12 and the bit line drive section 30A set the voltage of the bit line BL to be higher than the voltage of the source line SL. Thus, in the memory cell 20, a reset current Ireset flows from the selection transistor 22 toward the memory device 21 as illustrated in FIG. 3B. At that time, in the memory device 21, the reset current Ireset flows from the lower electrode 211 toward the upper electrode 213 (FIG. 2).

In addition, when the data reading operation is to be performed, the source line drive section 12 sets the voltage of the source line SL to the voltage Vss (0V in this example), and the read section 30B applies the positive bias voltage Vbias to the bit line BL in this example. Thus, the detection current Idet (=Vbias/R) according to a resistance value R of the memory device 21 flows from the selection transistor 22 toward the memory device 21 in the memory cell 20 as illustrated in FIG. 3B. At that time, the detection current Idet flows from the lower electrode 211 toward the upper electrode 213 in the memory device 21 (FIG. 2). Although the detection current Idet flows in a direction which is same as that of the reset current Ireset as illustrated in FIGS. 2 and 3B, its magnitude is set to be smaller than that of the reset current Ireset. That is, in the data reading operation, the detection current Idet is made small in order not to change the resistance state of the memory device 21 toward the high resistance state HRS. In addition, the read section 30B applies the bias voltage Vbias also to the reference memory cell 29 similarly. Thus, a reference current Iref is generated in the reference memory cell 29. Since the resistance value of the reference memory cell 29 is set to a resistance value between the resistance values in the two resistance states (the low resistance state LRS and the high resistance state HRS) of the memory device 21 as described above, the magnitude of the detection current Idet is larger than that of the reference current Iref when the resistance state of the memory device 21 is the low resistance state LRS, and is smaller than that of the reference current when the resistance state of the memory device 21 is the high resistance state HRS. The read section 30B reads out the resistance state (the low resistance state LRS or the high resistance state HRS) of the memory device 21 on the basis of the detection current Idet and the reference current Iref.

(Read Section 30B)

Figure 4:
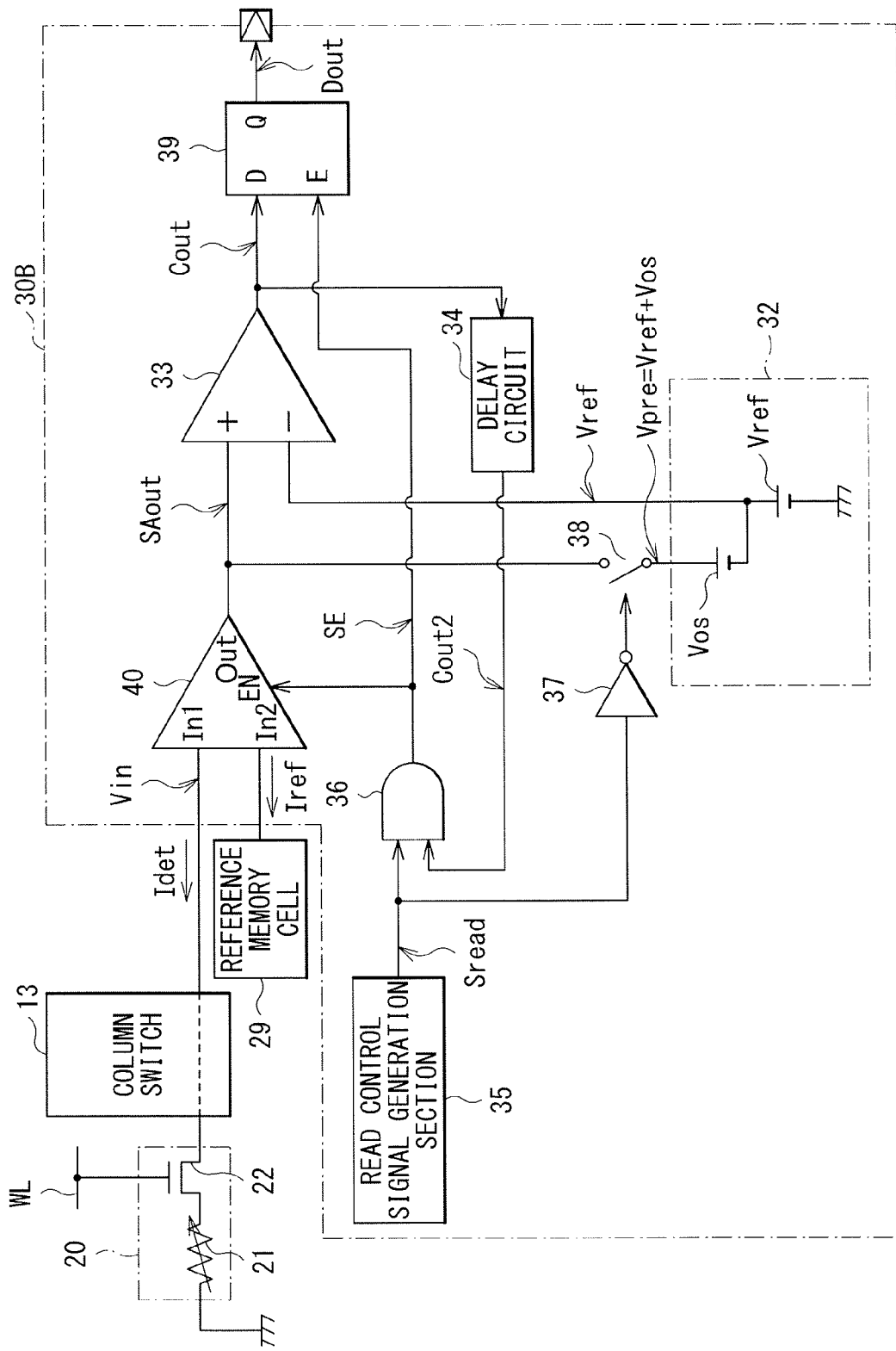
FIG. 4 is a block diagram illustrating one configuration example of a read section illustrated in FIG. 1.

FIG. 4 illustrates one configuration example of the read section 30B. The read section 30B includes a voltage generation section 32, a sense amplifier 40, a comparator 33, a delay circuit 34, a read control signal generation section 35, an AND circuit 36, an inverter 37, a switch 38, and a latch circuit 39.

The voltage generation section 32 generates a reference voltage Vref and a precharge voltage Vpre. The precharge voltage Vpre is a voltage (Vref+Vos) that an offset voltage Vos is added to the reference voltage Vref. The precharge voltage Vpre is a voltage with which an output terminal Out of the sense amplifier 40 is precharged prior to execution of the operation of reading out data from the memory cell 20 as described later.

The sense amplifier 40 generates and outputs a signal SAout on the basis of the detection current Idet, the reference current Iref, and a control signal SE (described later). The sense amplifier 40 includes input terminals In1 and In2, an enable terminal EN, and the output terminal Out. The input terminal In1 is connected to the column switch 13, and is connected to the memory cell 20 (the memory device 21) to be subjected to the reading operation via the column switch 13. The input terminal In2 is connected to the reference memory cell 29. The enable terminal EN is connected to an output terminal of the AND circuit 36 and the control signal SE is supplied to the enable terminal EN. The output terminal Out is connected to the comparator 33 and is also connected to one end of the switch 38.

Figure 5:
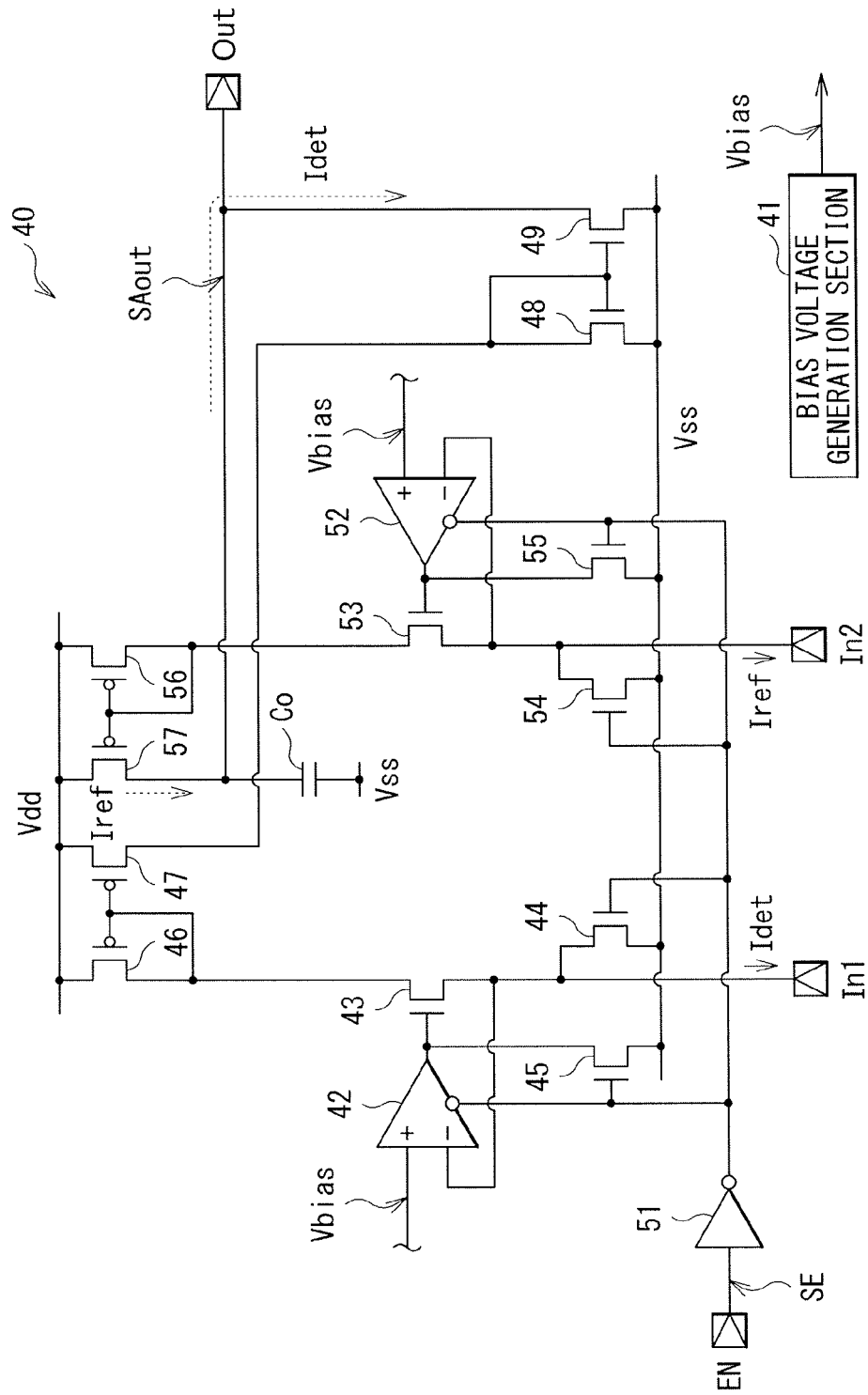
FIG. 5 is a circuit diagram illustrating one configuration example of a sense amplifier illustrated in FIG. 4.

FIG. 5 illustrates one configuration example of the sense amplifier 40. The sense amplifier 40 includes an inverter 51, a bias voltage generation circuit 41, operational amplifiers 42 and 52, transistors 43 to 49 and 53 to 57, and a capacitor Co. The transistors 43 to 45, 48, 49, and 53 to 55 are N-type MOS transistors, and the transistors 46, 47, 56, and 57 are P-type MOS transistors.

The inverter 51 outputs the control signal SE supplied from the enable terminal EN by inverting a logic level of the control signal SE. The bias voltage generation circuit 41 is a circuit for generating the bias voltage Vbias. The bias voltage Vbias is supplied to positive input terminals of the operational amplifiers 42 and 52.

The bias voltage Vbias is applied to the positive input terminal of the operational amplifier 42, a negative input terminal thereof is connected to a source of the transistor 43 and so forth, and an output terminal thereof is connected to a gate of the transistor 43 and so forth. In addition, a negative logic enable terminal of the operational amplifier 42 is connected to an output terminal of the inverter 51 and so forth. A drain of the transistor 43 is connected to a drain and a gate of the transistor 46 and so forth, the gate thereof is connected to an output terminal of the operational amplifier 42 and so forth, and the source thereof is connected to the negative input terminal of the operational amplifier 42 and so forth and to the input terminal In1. A drain of the transistor 44 is connected to the source of the transistor 43 and so forth and to the input terminal In1, a gate thereof is connected to the output terminal of the inverter 51 and so forth, and the voltage Vss is supplied to a source thereof. A drain of the transistor 45 is connected to the gate of the transistor 43 and so forth, a gate thereof is connected to the output terminal of the inverter 51 and so forth, and the voltage Vss is supplied to a source thereof.

Connection of the operational amplifier 52 with the transistors 53 to 55 is the same as the above-mentioned connection of the operational amplifier 42 with the transistors 43 to 45.

Owing to this configuration, when the control signal SE is at a high level (active) in the sense amplifier 40, the operational amplifier 42 and the transistor 43 perform a negative feedback operation to set the voltage of the input terminal In1 to the bias voltage Vbias, and the operational amplifier 52 and the transistor 53 also performs the negative feedback operation to set the voltage of the input terminal In2 to the bias voltage Vbias. Thus, the detection current Idet according to the resistance value R of the memory device 21 flows from the input terminal In1 toward the memory device 21, and the reference current Iref flows from the input terminal In2 toward the reference memory cell 29. In addition, when the control signal SE is at a low level, since the operations of the operational amplifiers 42 and 52 are stopped and the transistors 45 and 55 enter ON states, the respective negative feedback operations are stopped. Then, since the transistors 44 and 54 enter the ON states, the voltages of the respective input terminals In1 and In2 are set to the voltage Vss.

The drain of the transistor 46 is connected to the gate of the transistor 46, a gate of the transistor 47, and the drain of the transistor 43, and a voltage Vdd is supplied to a source thereof. A drain of the transistor 47 is connected to a drain and a gate of the transistor 48 and so forth, the gate thereof is connected to the drain and the gate of the transistor 46 and so forth, and the voltage Vdd is supplied to a source thereof. In this example, the dimensions (a gate width W and a gate length L) of the transistor 46 and the transistor 47 are the same as each other. Owing to this configuration, the transistors 46 and 47 configure a so-called current mirror circuit.

A drain of the transistor 56 is connected to a gate of the transistor 56, a gate of the transistor 57, and a drain of the transistor 53, and the voltage Vdd is supplied to a source thereof. A drain of the transistor 57 is connected to a drain of the transistor 49 and one end of the capacitor Co, the gate thereof is connected to the drain and the gate of the transistor 56 and so forth, and the voltage Vdd is supplied to a source thereof. In this example, the dimensions (the gate width W and the gate length L) of the transistor 56 and the transistor 57 are the same as each other. Owing to this configuration, the transistors 56 and 57 configure the so-called current mirror circuit.

The one end of the capacitor Co is connected to the drain of the transistor 57, the drain of the transistor 49, and an output terminal Out of the sense amplifier 40, and the voltage Vss is supplied to the other end thereof.

The drain of the transistor 48 is connected to the gate of the transistor 48, a gate of the transistor 49, and the drain of the transistor 47, and the voltage Vss is supplied to the source thereof. The drain of the transistor 49 is connected to the drain of the transistor 57, the one end of the capacitor Co, and the output terminal Out of the sense amplifier 40, the gate thereof is connected to the drain and the gate of the transistor 48 and so forth, and the voltage Vss is supplied to a source thereof. In this example, the dimensions (the gate width W and the gate length L) of the transistor 48 and the transistor 49 are the same as each other. Owing to this configuration, the transistors 48 and 49 configure the so-called current mirror circuit.

Owing to this configuration, the sense amplifier 40 performs operations which are different depending on the control signal SE. Specifically, when the control signal SE is at the high level (active), the sense amplifier 40 sets the voltages of the two input terminals In1 and In2 to the bias voltage Vbias. Thus, the detection current Idet flows in order of the transistor 46, the transistor 43, and the input terminal In1, and the reference current Iref flows in order of the transistor 56, the transistor 53, and the input terminal In2. A current which is equal to the detection current Idet flows through the transistor 49 by the current mirror circuit configured by the transistors 46 and 47 and the current mirror circuit configured by the transistors 48 and 49. A current which is equal to the reference current Iref flows through the transistor 57 by the current mirror circuit configured by the transistors 56 and 57. Therefore, a current corresponding to a difference (Iref−Idet) between the reference current Iref and the detection current Idet flows into the one end of the capacitor Co, and a voltage (a signal SAout) at the one end of the capacitor Co is changed. Thus, the voltage of the signal SAout is changed at a speed according to that difference in a voltage direction according to a magnitude correlation between the detection current Idet and the reference current Iref. In other words, the voltage of the signal SAout is changed at a speed according to the resistance value R of that memory device 21 in the voltage direction according to the resistance state (the low resistance state LRS or the high resistance state HRS) of that memory device 21. Specifically, for example, when the resistance state of the memory device 21 is the low resistance state LRS, the detection current Idet may become larger than the reference current Iref (Idet>Iref) and the voltage of the signal SAout may decrease at the speed according to the resistance value R. In addition, for example, when the resistance state of the memory device 21 is the high resistance state HRS, the detection current Idet may become smaller than the reference current Iref (Idet<Iref) and the voltage of the signal SAout may increase at the speed according to the resistance value R.

On the other hand, when the control signal SE is at the low level, the sense amplifier 40 sets the voltages of the two input terminals In1 and In2 to the voltage Vss, and a node of the output terminal Out enters a high impedance state so as to maintain the voltage level of the signal SAout.

In FIG. 4, the comparator 33 compares the voltage of the signal SAout with the reference voltage Vref and outputs a result thereof as a signal Cout. A positive input terminal of the comparator 33 is connected to the output terminal Out of the sense amplifier 40 and the signal SAout is input into the positive input terminal. In addition, the reference voltage Vref is supplied to the negative input terminal thereof.

The delay circuit 34 delays the signal Cout by a delay time td to generate a signal Cout2. The delay circuit 34 is inserted in order to ensure a setup time in the later described latch circuit 39. Incidentally, when it is possible to ensure the setup time of the latch circuit 39 without the delay circuit 34, the delay circuit 34 may be omitted.

The read control signal generation circuit 35 generates a read control signal Sread. The read control signal Sread is a logic signal for controlling the data reading operation, and when the reading operation is to be performed, the read control signal Sread is at the high level, while when the reading operation is not performed, the read control signal Sread is at the low level.

The AND circuit 36 is a circuit that obtains AND of the read control signal Sread and the signal Cout2 and outputs a result thereof as the control signal SE.

The inverter 37 is a circuit that logically inverts the read control signal Sread and outputs the logically-inverted read control signal Sread. The switch 38 is a switch turned on/off on the basis of an output signal from the inverter 37, one end thereof is connected to the output terminal Out of the sense amplifier 40 and a positive input terminal of the comparator 33, and the precharge voltage Vpre is supplied to the other end thereof. In this example, the switch 38 enters an ON state when the signal supplied from the inverter 37 is at the high level. Owing to this configuration, the switch 38 has a function of precharging the output terminal Out (the signal SAout) of the sense amplifier 40 prior to execution of the operation of reading out data from the memory cell 20.

The latch circuit 39 is a circuit that determines the resistance state (the low resistance state LRS or the high resistance state HRS) of the memory device 21 on the basis of the signal Cout and the control signal SE and outputs a result of determination as a signal Dout. The latch circuit 39 includes input terminals D and E. The input terminal D of the latch circuit 39 is connected to the output terminal of the comparator 33 and so forth and the signal Cout is supplied to the input terminal D. The input terminal E is connected to an output terminal of the AND circuit 36 and so forth and the control signal SE is supplied to the input terminal E. The latch circuit 39 outputs the signal Cout as it is as the signal Dout when the control signal SE is at the high level (active), and retains the signal Dout obtained directly before transition of the control signal SE after the control signal SE has transited from the high level to the low level. The signal Dout indicates data stored in the memory device 21. That is, in the signal Dout, the high level indicates that the resistance state of the memory device 21 is the high resistance state HRS and the low level indicates that the resistance state of the memory device 21 is the low resistance state LRS.

Owing to this configuration, the read section 30B applies the bias voltage Vbias to the memory device 21 and reads out the data on the basis of the detection current Idet generated in the memory device 21 with the bias voltage Vbias in the data reading operation. In that case, the read section 30B operates to reduce a time for which the bias voltage Vbias is applied to the memory device 21 when the resistance state of the memory device 21 is the low resistance state LRS. Thus, it becomes possible to make the read disturb difficult to occur in the semiconductor device 1.

Here, part of the sense amplifier 40, the AND circuit 36, and the delay circuit 34 correspond to one specific example of a "bias application section" in one embodiment of the present disclosure. The bias voltage Vbias corresponds to one specific example of a "bias signal" in one embodiment of the present disclosure. The sense amplifier 40, the comparator 33, and the latch circuit 39 correspond to one specific example of a "determination section" in one embodiment of the present disclosure. The detection current Idet corresponds to one specific example of a "detection signal" in one embodiment of the present disclosure. The signal SAout corresponds to one specific example of a "first signal" in one embodiment of the present disclosure. The signal Cout corresponds to one specific example of a "second signal" in one embodiment of the present disclosure. The read control signal generation section 35 corresponds to one specific example of a "signal generation section" in one embodiment of the present disclosure. The AND circuit 36 and the delay circuit 34 correspond to one specific example of a "pulse signal generation circuit" in one embodiment of the present disclosure. The control signal SE corresponds to one specific example of a "pulse signal" in one embodiment of the present disclosure. The inverter 37, the switch 38, and the voltage generation section 32 correspond to one specific example of a "precharge circuit" in one embodiment of the present disclosure.

[Operations and Functions]

Operations and functions of the semiconductor device 1 according to the present embodiment will be described.

(Outline of General Operation)

First, outline of the general operation of the semiconductor device 1 will be described with reference to FIGS. 1, 4 and so forth. The word line drive section 11 selects the memory cell 20 to be driven by applying a signal to the word line WL. The source line drive section 12 applies a voltage to the other end of the memory device 21 of the memory cell 20 which has been selected to be driven by applying a signal to the source line SL. The bit line drive section-read section 30 selectively performs the data writing operation or the data reading operation on the memory cell 20 which has been selected to be driven via the column switch 13 and the bit line BL.

In the data reading operation, the read section 30B of the bit line drive section-read section 30 applies the bias voltage Vbias to the bit line BL and reads out data on the basis of the detection current Idet generated in the memory device 21 with that bias voltage Vbias. Specifically, the voltage generation section 32 generates the reference voltage Vref and the precharge voltage Vpre. The sense amplifier 40 generates and outputs the signal SAout on the basis of the reference current Iref, the detection current Idet, and the control signal SE. The voltage of this signal SAout is changed at the speed according to the resistance value R of the memory device 21 in the voltage direction according to the resistance state (the low resistance state LRS or the high resistance state HRS) of the memory device 21. The comparator 33 compares the voltage of the signal SAout with the reference voltage Vref and outputs a result thereof as the signal Cout. The delay circuit 34 delays the signal Cout and generates the signal Dout2. The read control signal generation circuit 35 generates the read control signal Sread. The AND circuit 36 obtains AND of the read control signal Sread and the signal Cout2 and outputs a result thereof as the control signal SE. The inverter 37 logically inverts the read control signal Sread and outputs the logically-inverted read control signal Sread. The switch 38 supplies the precharge voltage Vpre that the voltage generation section 32 has generated to the output terminal Out of the sense amplifier 40 on the basis of the output signal from inverter 37 to precharge the output terminal Out. The latch circuit 39 determines the resistance state (the low resistance state LRS or the high resistance state HRS) of the memory device 21 on the basis of the signal Cout and the control signal SE and outputs the result of determination as the signal Dout.

(Detailed Operations)

The data reading operation will be described in detail with reference to operations in the case that the resistance state of the memory device 21 is the high resistance state HRS and the case that the state is the low resistance state LRS.

Figure 6:
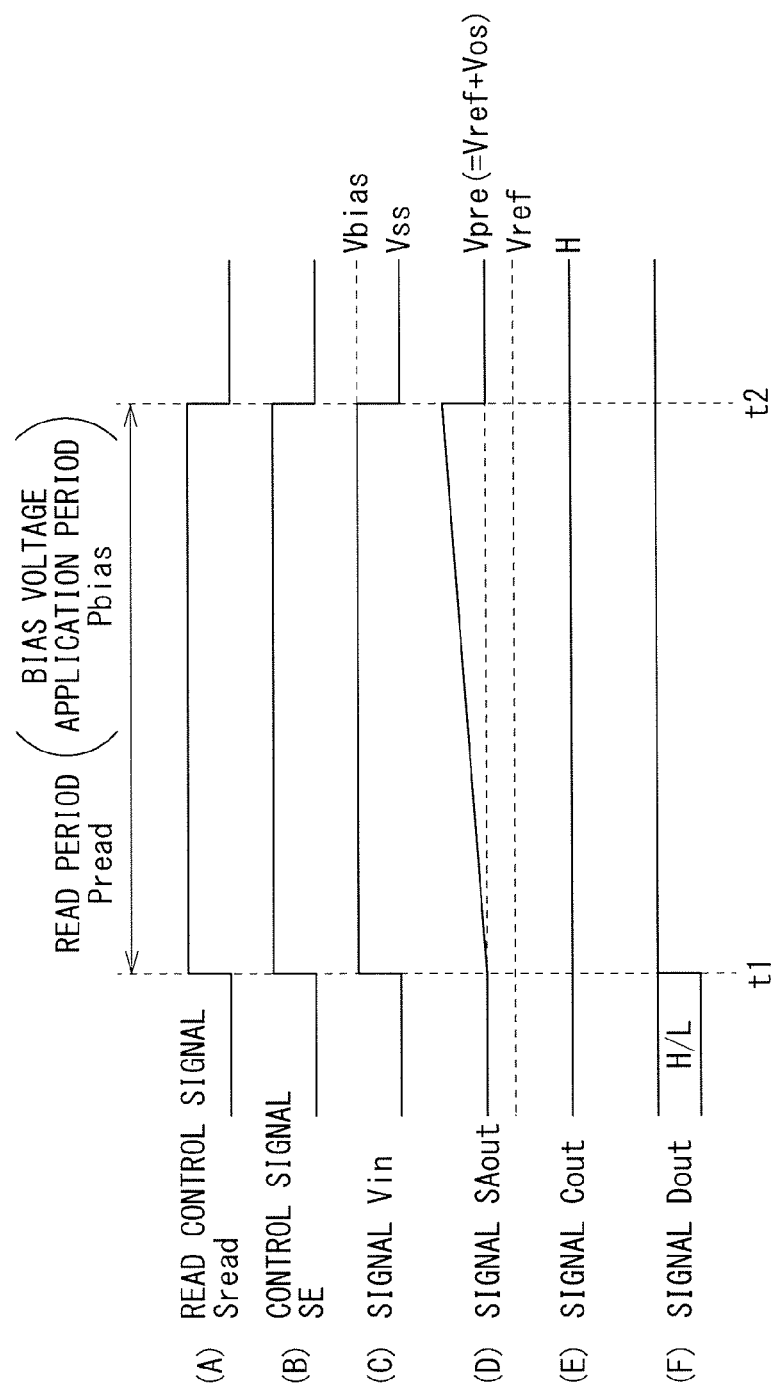
FIG. 6 is a timing waveform chart illustrating one operational example of a read section illustrated in FIG. 4.

FIG. 6 illustrates a timing chart of one example of the operation of reading resistance data in the memory device 21 when the resistance state of the memory device 21 is the high resistance state HRS, in which (A) indicates a waveform of the read control signal Sread, (B) indicates a waveform of the control signal SE, (C) indicates a waveform of a signal Vin at the input terminal In1 of the sense amplifier 40, (D) indicates a waveform of the signal SAout, (E) indicates a waveform of the signal Cout, and (F) indicates a waveform of the signal Dout. In (F) of FIG. 6, "H/L" indicates that the signal level of the signal Dout is the high level or the low level.

In the read section 30B, the read control signal generation section 35 makes the read control signal Sread transit from the low level to the high level, a read period Pread is started and the reading operation is performed. Then, the read control signal generation section 35 makes the read control signal Sread transit from the high level to the low level, and when the read period Pread has expired, the high-level signal Dout according to the resistance state (the high resistance state HRS) of the memory device 21 is generated. In the following, details of this operation will be described.

First, the read control signal generation section 35 outputs the low-level read out control signal Sread in a period before a timing t1 ((A) of FIG. 6). Thus, the control signal SE turns to the low level ((B) of FIG. 6) and the sense amplifier 40 sets the voltages of the two input terminals In1 and In2 to the voltage Vss ((C) of FIG. 6). In addition, since the node of the output terminal Out of the sense amplifier 40 enters a high impedance state and the switch 38 enters the ON state, the output terminal Out (the signal SAout) of the sense amplifier 40 is set to the precharge voltage Vpre ((D) of FIG. 6). Therefore, since the voltage (the precharge voltage Vpre (=Vref+Vos) at the positive input terminal is higher than the voltage (the reference voltage Vref) at the negative input terminal, the comparator 33 outputs the high-level signal Cout ((E) of FIG. 6). Thus, also the output signal Cout2 from the delay circuit 34 reaches the high level.

Then, at the timing t1, the read control signal generation section 35 makes the read control signal Sread transit from the low level to the high level ((A) of FIG. 6). Thus, the switch 38 enters an OFF state and supply of the precharge voltage Vpre to the output terminal Out (the signal SAout) of the sense amplifier 40 is stopped. In addition, the control signal SE transits from the low level to the high level on the basis of transition of this read control signal Sread ((B) of FIG. 6) and the sense amplifier 40 sets the voltages of the two input terminals In1 and In2 to the bias voltage Vbias ((C) of FIG. 6). Thus, the detection current Idet flows from the input terminal In1 of the sense amplifier 40 toward the memory device 21 and the reference current Iref flows from the input terminal In2 toward the reference memory cell 29. Since the resistance state of the memory device 21 is the high resistance state HRS, this direction current Idet is smaller than the reference current Iref (Idet<Iref). Therefore, the voltage of the output signal SAout of the sense amplifier 40 slowly rises as time goes on ((D) of FIG. 6). Since the voltage of the signal SAout is higher than the reference voltage Vref on a consistent basis in the read period Pread as described above, the output signal Cout from the comparator 33 is retained consistently at the high level ((E) of FIG. 6) and also the output signal Dout from the latch circuit 39 is retained consistently at the high level ((F) of FIG. 6).

Then, at a timing t2, the read control signal generation section 35 makes the read control signal Sread transit from the high level to the low level ((A) of FIG. 6). Thus, also the control signal SE transits from the high level to the low level ((B) of FIG. 6), and the sense amplifier 40 sets the voltages of the two input terminals In1 and In2 to the voltage Vss as in the period before the timing t1 ((C) of FIG. 6) and stops application of the bias voltage Vbias to the memory device 21. That is, in this example, a period (a bias voltage application period Pbias) for which the bias voltage Vbias is applied to the memory device 21 matches the read period Pread. At the timing t2, the switch 38 enters the ON state and the output terminal Out (the signal SAout) of the sense amplifier 40 is set to the precharge voltage Vpre ((D) of FIG. 6). In addition, at the timing t2, since the voltage (the control signal SE) of the input terminal E has transited to the low level, the latch circuit 39 retains the signal Dout (the high level) obtained directly before the timing t2 and keeps outputting the high level signal Dout thereafter.

The data reading operation performed when the resistance state of the memory device 21 is the low resistance state LRS will be described.

Figure 7:
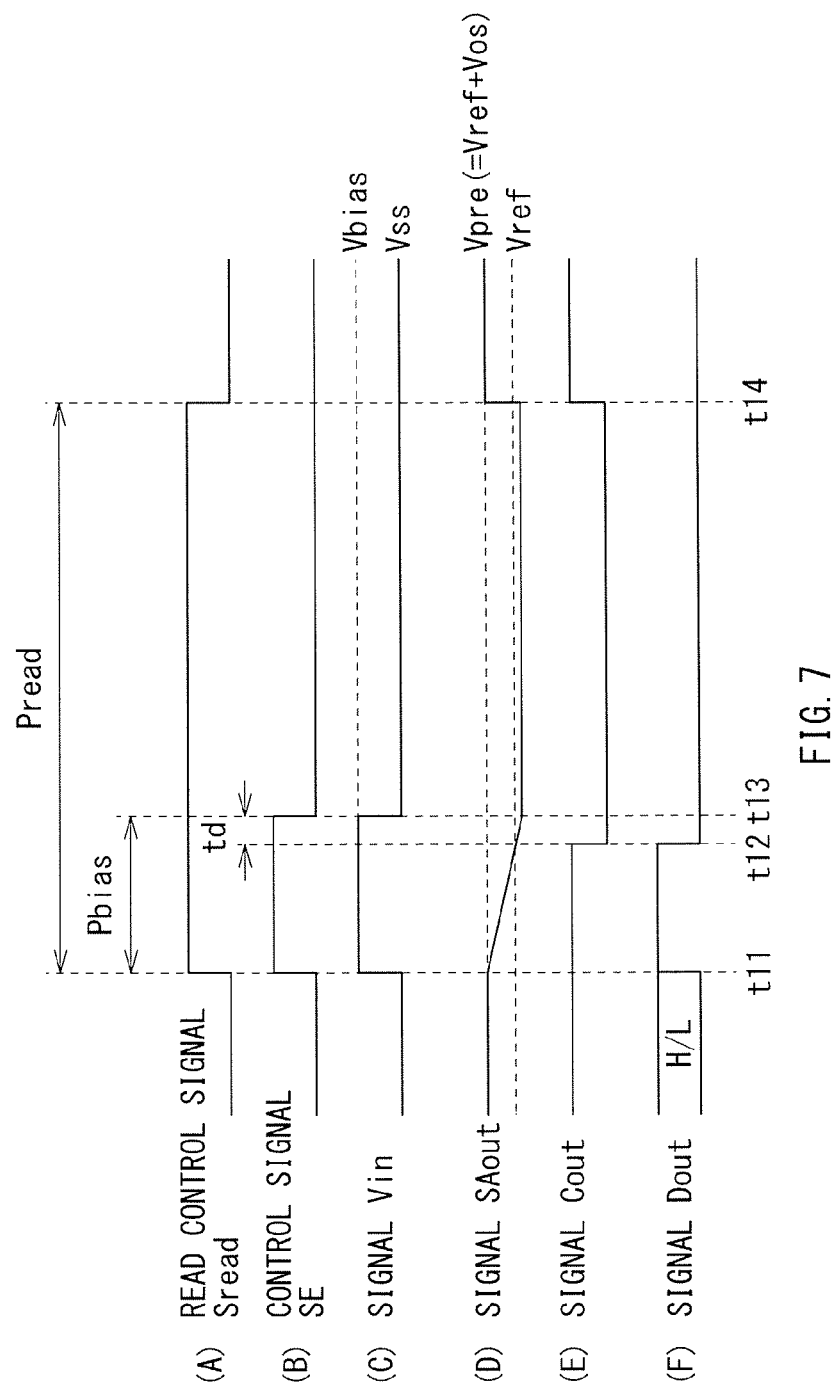
FIG. 7 is a timing waveform chart illustrating another operational example of the read section illustrated in FIG. 4.

FIG. 7 illustrates a timing chart of one example of the operation of reading resistance data in the memory device 21 when the resistance state of the memory device 21 is the low resistance state LRS, in which (A) indicates a waveform of the read control signal Sread, (B) indicates a waveform of the control signal SE, (C) indicates a waveform of the signal Vin, (D) indicates a waveform of the signal SAout, (E) indicates a waveform of the signal Cout, and (F) indicates a waveform of the signal Dout.

The data reading operation is performed in the read period Pread in the read section 30B also when the resistance state of the memory device 21 is the low resistance state LRS as in the case (FIG. 6) of the high resistance state HRS. In this case, the read section 30B applies the bias voltage Vbias to the memory device 21 in a period which is shorter than the read period Pread, and when application has been terminated, the read section 30B generates the low-level signal Dout according to the resistance state (the low resistance state LRS) of the memory device 21. In the following, details of this operation will be described.

First, at a timing t11, the read control signal generation section 35 makes the read control signal Sread transit from the low level to the high level ((A) of FIG. 7). Thus, the control signal SE transits from the low level to the high level ((B) of FIG. 7), the sense amplifier 40 sets the voltages of the two input terminals In1 and In2 to the bias voltage Vbias ((C) of FIG. 7), and the detection current Idet and the reference current Iref flow. Since the resistance state of the memory device 21 is the low resistance state LRS, the detection current Idet is larger than the reference current Iref (Idet>Iref). Therefore, the voltage of the output signal SAout of the sense amplifier 40 drops rather rapidly as time goes on in this example ((D) of FIG. 7).

Then, when the voltage of the signal SAout reaches the reference voltage Vref (a timing t12), the output signal Cout of the comparator 33 transits from the high level to the low level ((E) of FIG. 7), and also the output signal Dout of the latch circuit 39 transits from the high level to the low level accordingly ((F) of FIG. 7). This signal Cout is delayed by a delay time td by the delay circuit 34. Then, the AND circuit 36 makes the control signal SE transit from the high level to the low level at a timing t13 which is delayed from the timing t12 by the delay time td by the delay circuit 34 ((C) of FIG. 7). Thus, the sense amplifier 40 sets the voltages of the two input terminals In1 and In2 to the voltage Vss ((C) of FIG. 7) and stops application of the bias voltage Vbias to the memory device 21. Then, since the node of the output terminal Out of the sense amplifier 40 enters the high-impedance state, the level of the signal SAout is maintained.

In addition, at the timing t13, since the voltage (the control signal SE) of the input terminal E has transited to the low level, the latch circuit 39 retains the signal Dout (the low level) obtained directly before the timing t13 and keeps outputting the low level signal Dout thereafter.

Then, at a timing t14, the read control signal generation section 35 makes the read control signal Sread transit from the high level to the low level ((A) of FIG. 7). Thus, the switch 38 enters the ON state and the output terminal Out (the signal SAout) of the sense amplifier 40 is set to the precharge voltage Vpre (=Vref+Vos) ((D) of FIG. 7). The output signal Cout of the comparator 33 transits from the low level to the high level accordingly ((E) of FIG. 7).

As described above, in the read section 30B, the voltage of the signal SAout is set to the precharge voltage Vpre prior to the read period Pread and the control signal SE is generated on the basis of the output signal Cout from the comparator 33 so as to control the operation of the sense amplifier 40. Thus, it is possible to reduce the time of the bias voltage application period Pbias to be set when the resistance state of the memory device 21 is the low resistance state LRS, and it is possible to make the read disturb difficult to occur as described later.

In addition, since in the read section 30B, the voltage of the signal SAout has been set to the precharge voltage Vpre (=Vref+Vos) which is different from the reference voltage Vref by the offset voltage Vos, it is possible to reduce the read period Preadt and hence it is possible to improve the throughput of the data reading operation. That is, for example, when the voltage level of the signal SAout is close to the voltage level of the reference voltage Vref, the signal Cout of the comparator 33 may possibly not reach a desired level such that the level of the output signal Cout of the comparator 33 exhibits an intermediate level between the low level and the high level. Therefore, when the resistance state of the memory device 21 is the high resistance state HSR and, for example, if the offset voltage Vos is not prepared, the signal Cout will not reach the desired level (the high level) and the read period Pread will be further increased unless after the signal SAout has risen to some extent. In contrast, since in the read section 30B, the offset voltage Vos is prepared, it is possible to reduce the time taken until the signal Cout reaches the desired level (the high level) when the resistance state of the memory device 21 is the high resistance state (HRS). Thus, it is possible to reduce the read period Pread and therefore it is possible to improve the throughput.

(Read Disturb)

Although the memory device 21 has the two distinguishable resistance states (the low resistance state LRS and the high resistance state HRS), the memory state in the memory device 21 may be inverted and/or rewriting of the data may possibly become difficult by applying the bias voltage Vbias in the data reading operation. In the following, such so-called read disturb will be described.

First, a case that the resistance state of the memory device 21 is the low resistance state LRS will be described.

Figure 8:
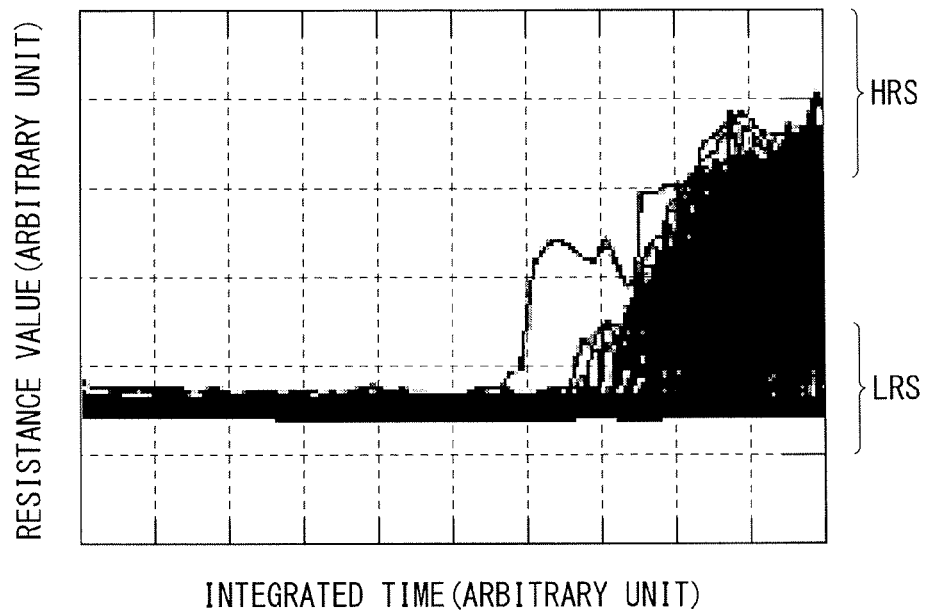
FIG. 8 is a characteristic diagram illustrating one example of read disturb of the memory device illustrated in FIG. 1.

FIG. 8 illustrates an example of a change in resistance value of the memory device 21 when the bias voltage Vbias has been applied to the memory device 21 to make the detection current Idet flow in the data reading operation. The lateral axis indicates an integrated time of times for which the bias voltage Vbias has been applied. Characteristic lines in FIG. 8 indicate respective characteristics of different individuals.

When the data reading operation is performed a plurality of times and the integrated time is increased, the resistance value R of the memory device 21 may possibly be increased and then the resistance state thereof may possibly change from the low resistance state LRS to the high resistance state HRS as illustrated in FIG. 8. That is, the detection current Idet that flows in the data reading operation flows in the same direction as the reset current Ireset that flows when the memory device 21 is brought to the high resistance state HRS in the data writing operation in this example. Therefore, when the bias voltage Vbias is applied to the memory device 21 in the data reading operation to let the detection current Idet flow in the same direction as the reset current Ireset, the resistance state may possibly change gradually from the low resistance state LRS toward the high resistance state HRS every time the reading operation is performed. In addition, the change in resistance state also depends on the bias voltage Vbias. That is, the higher the bias voltage Vbias is, the more change from the low resistance state LRS to the high resistance state HRS may possibly be accelerated in a shorter integrated time.

On the other hand, if the bias voltage Vbais2 which is different from the bias voltage Vbais in polarity is applied to reverse the flowing direction of the detection current Idet in the data reading operation, this may possibly make rewriting difficult when attempting to rewrite the data after that reading operation has been performed as described hereinafter.

Figure 9:
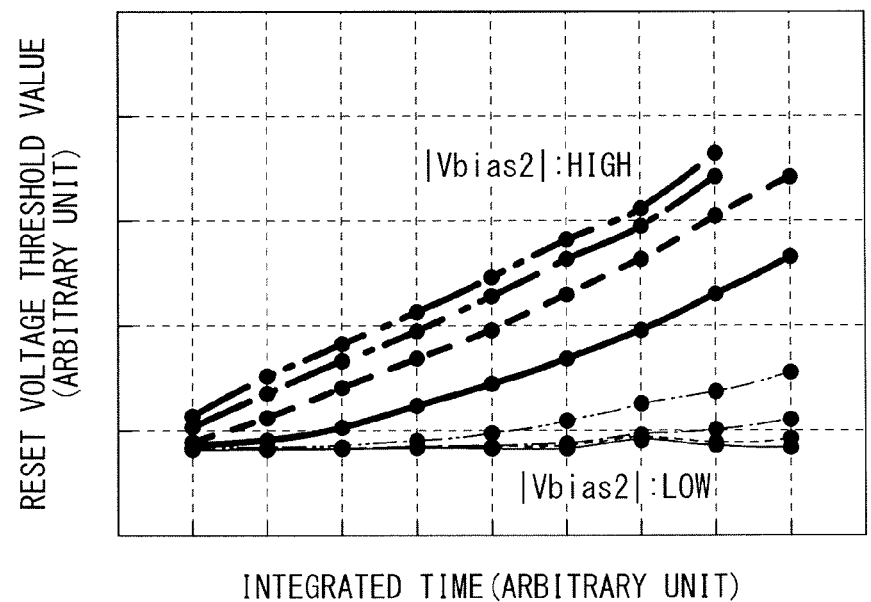
FIG. 9 is a characteristic diagram illustrating another example of the read disturb of the memory device illustrated in FIG. 1.

FIG. 9 illustrates an example of a change in reset voltage threshold value after the bias voltage Vbias2 has been applied to the memory device 21 to make the detection current Idet flow in the same direction (FIG. 3A) as the set current Iset in the data reading operation. Here, the reset voltage threshold value is a bias voltage which is necessary to cause a change (reset) from the low resistance state LRS to the high resistance state HRS.

As the integrated time is increased by performing the data reading operation the plurality of times, the reset voltage threshold value is increased as illustrated in FIG. 9. This means that the memory device 21 enters a more deeply set state by making the detection current Idet flow in the same direction as the set current Iset over a long period of time in the data reading operation and it becomes difficult to reset it in the later writing operation. In addition, as illustrated in FIG. 9, the higher an absolute value |Vbias2| of the bias voltage Vbias2 is, the more the reset voltage threshold value is increased in a shorter integrated time. This means that the memory device 21 enters the more deeply set state in the data reading operation as the value |Vbias2| is set higher, and it becomes more difficult to reset it in the later data writing operation.

A case that the resistance state of the memory device 21 is the high resistance state HRS will be described.

Figure 10:
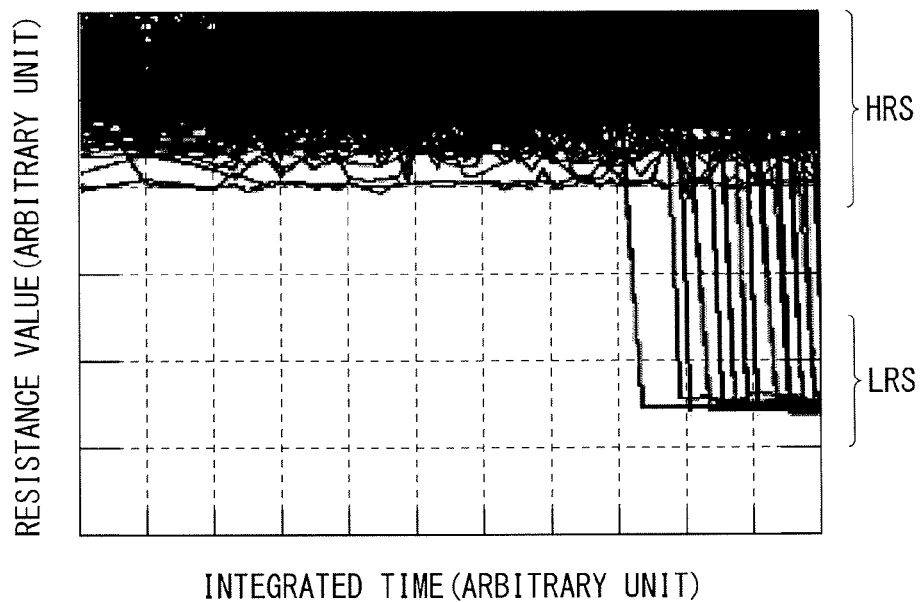
FIG. 10 is a characteristic diagram illustrating a further example of the read disturb of the memory device illustrated in FIG. 1.

FIG. 10 illustrates an example of a change in resistance value of the memory device 21 when it is assumed that the bias voltage Vbias2 which is different from the bias voltage Vbias in polarity is applied to make the detection current Idet flow in the same direction (FIG. 3A) as the set current Iset in the data reading operation. When the integrated time is increased by performing the data reading operation the plurality of times, the resistance value of the memory device 21 may possibly be reduced and the resistance state thereof may possibly change from the high resistance state HRS to the low resistance state LRS as illustrated in FIG. 10. That is, since the set current Iset is a current that flows when the resistance state of the memory device 21 is to be changed to the low resistance state LRS, when the bias voltage Vbias2 is applied to the memory device 21 to make the detection current Idet flow in the same direction as the set current Iset in the reading operation, the resistance state thereof may possibly change gradually from the high resistance state HRS toward the low resistance state LRS every time the reading operation is performed.

Figure 11:
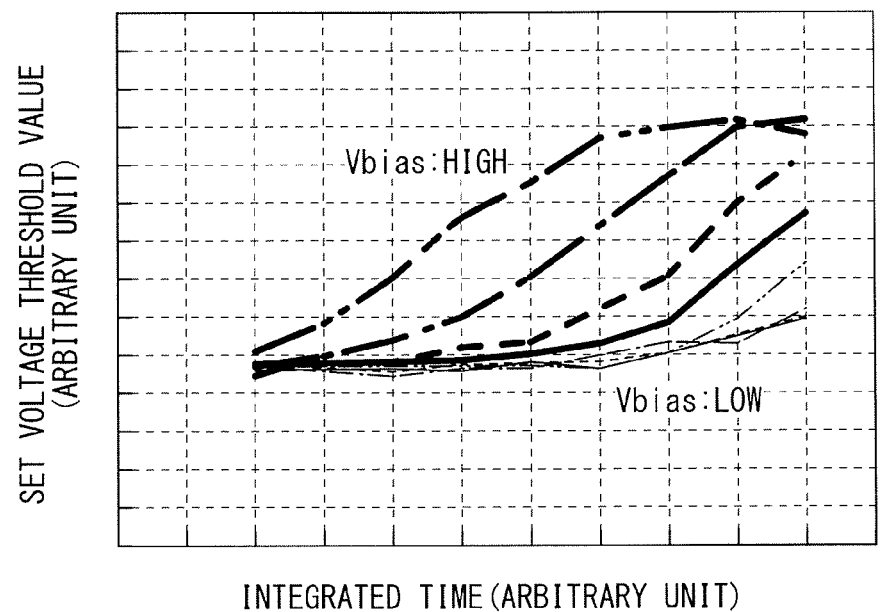
FIG. 11 is a characteristic diagram illustrating a still further example of the read disturb of the memory device illustrated in FIG. 1.

FIG. 11 illustrates an example of a change in set voltage threshold value after the bias voltage Vbias has been applied to the memory device 21 to make the detection current Idet flow in the same direction (FIG. 3B) as the reset current Ireset. Here, the set voltage threshold value is a bias voltage which is necessary to cause a change (set) from the high resistance state HRS to the low resistance state LRS. The set voltage threshold value is increased as the integrated time is increased by performing the data reading operation the plurality of times as illustrated in FIG. 11. This means that the memory device 21 enters a more deeply reset state by making the detection current Idet flow in the same direction as the reset current Ireset over a long period of time in the data reading operation and it becomes more difficult to set it in the later writing operation. In addition, the higher the bias voltage Vbias is, the more the set voltage threshold value is increased in a shorter integrated time. This means that the memory device enters the more deeply reset state as the voltage Vbias is set higher in the data reading operation and it becomes more difficult to set it in the later writing operation.

As described above, when the bias voltage Vbias is applied over the long period of time in the data reading operation, the memory state in the memory device 21 may possibly be inverted (FIGS. 8 and 10) and later data rewriting may possibly become difficult (FIGS. 9 and 11). If such read disturb occurs, the reliability of data stored in the memory device 21 will be lost.

In the semiconductor device 1 according to the present embodiment, the bias voltage application period Pbias to be set when the resistance state of the memory device 21 is the high resistance state HRS is reduced by generating the control signal SE on the basis of the output signal Cout from the comparator 33 thereby to control the operation of the sense amplifier 40 in the read section 30B. Thus, it is possible to make the read disturb difficult to occur. That is, since data is maintained in the nonvolatile memory even after the power source has been turned off unlike the volatile memories such as a DRAM, an SRAM and so forth, a time taken until data is rewritten the next after the data has been once written is increased. Therefore, since it is likely that many reading operations are performed in that period, the read disturb may possibly occur by integration of the bias voltage application periods Pbias. Since in the semiconductor device 1, the bias voltage application period Pbias to be set when the resistance state of the memory device 21 is the low resistance state LRS is reduced, it is possible to reduce the integrated time and hence it is possible to make the read disturb difficult to occur.

Comparative Example

Functions of the present embodiment will be described in comparison to the comparative example. The present comparative example is configured to precharge the voltage of the output terminal Out of the sense amplifier 40 with the reference voltage Vref in place of the precharge voltage Vpre and to control the operations of the sense amplifier 40 and the latch circuit 39 on the basis of the read control signal Sread in place of the control signal SE. Other configurations are the same as those of the present embodiment (FIG. 1 and so forth).

Figure 12:
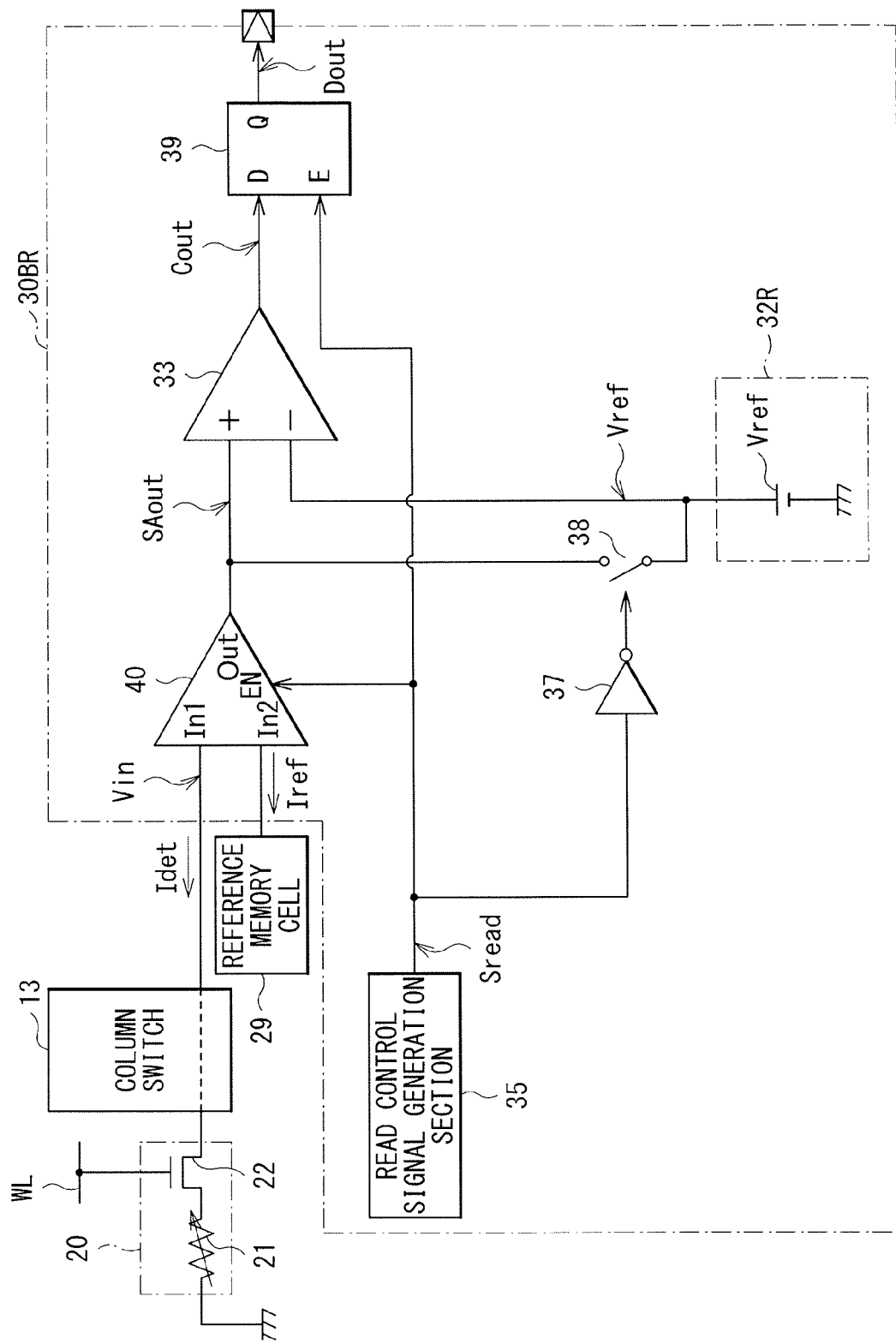
FIG. 12 is a block diagram illustrating a configuration example of a read section according to a comparative example.

FIG. 12 illustrates one configuration example of a read section 30BR according to the comparative example. The read section 30BR includes a voltage generation section 32R, the sense amplifier 40, the comparator 33, the read control signal generation section 35, the inverter 37, the switch 38, and the latch circuit 39. That is, the read section 30BR according to the comparative example is of the type that the delay circuit 34 and the AND circuit 36 are eliminated from the read section 30B according to the present embodiment, and the voltage generation section 32 is replaced with the voltage generation section 32R. The voltage generation section 32R generates only the reference voltage Vref and supplies the voltage to the negative input terminal of the comparator 33 and the other end of the switch 38. The read section 30BR according to the comparative example is configured to control the operations of the sense amplifier 40 and the latch circuit 39 on the basis of the read control signal Sread and to precharge the voltage of the output terminal Out of the sense amplifier 40 with the reference voltage Vref.

Details of the data reading operation will be described with reference to the operations in the case that the resistance state of the memory device 21 is the high resistance state HRS and the case that the state is the low resistance state LRS.

Figure 13:
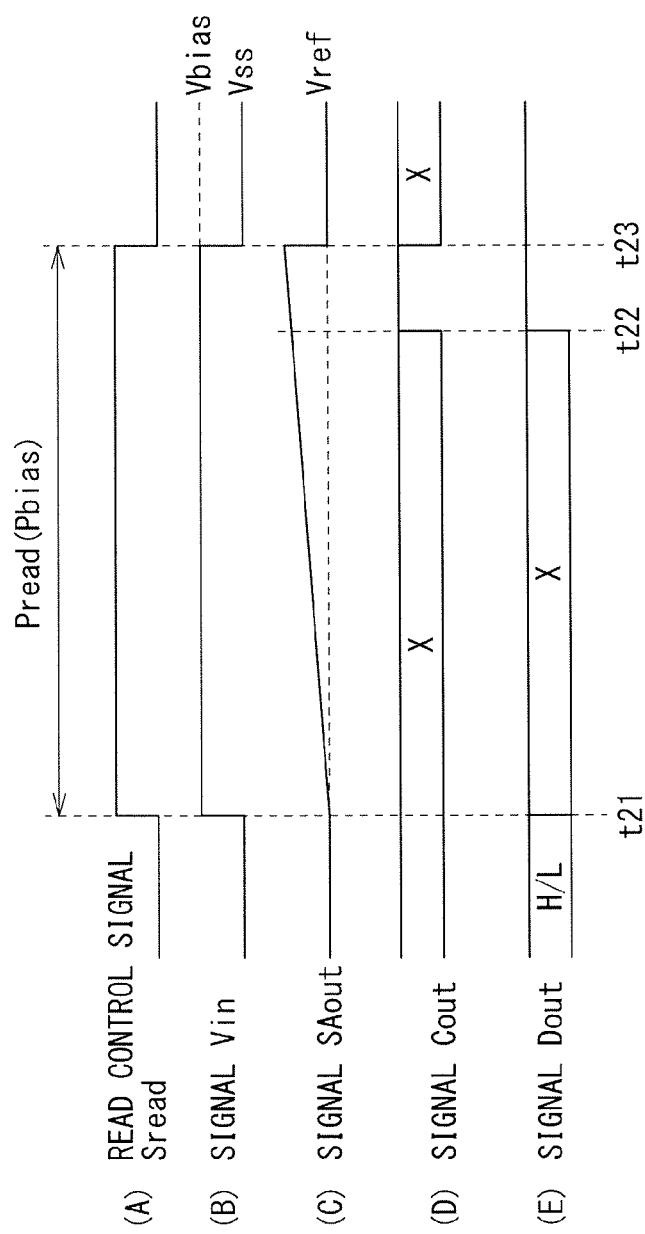
FIG. 13 is a timing waveform chart illustrating one operational example of the read section illustrated in FIG. 12.

FIG. 13 illustrates a timing chart of one example of the operation of reading resistance data in the memory device 21 when the resistance state of the memory device 21 is the high resistance state HRS, in which (A) indicates a waveform of the read control signal Sread, (B) indicates a waveform of the signal Vin, (C) indicates a waveform of the signal SAout, (D) indicates a waveform of the signal Cout, and (E) indicates a waveform of the signal Dout. In (D) and (E) of FIG. 13, "x" indicates an indefinite value.

First, in a period before a timing t21, the read control signal generation section 35 outputs the low-level read control signal Sread ((A) of FIG. 13). Thus, the sense amplifier 40 sets the voltages of the two input terminals In1 and In2 to the voltage Vss ((B) of FIG. 13). In addition, since the switch 38 enters the ON state and the node of the output terminal Out of the sense amplifier 40 enters the high impedance state, the voltage of the output terminal Out (the signal SAout) of the sense amplifier 40 is set to the reference voltage Vref which is the same as the voltage of the negative input terminal ((C) of FIG. 13). Therefore, the comparator 33 may output the signal Cout of for example, an intermediate level or the like ((D) of FIG. 13).

Then, at a timing t21, the read control signal generation section 35 makes the read control signal Sread transit from the low level to the high level ((A) of FIG. 13). Thus, the switch 38 enters the OFF state and supply of the reference voltage Vref to the output terminal Out (the signal SAout) of the sense amplifier 40 is stopped. Simultaneously with the above, the sense amplifier 40 sets the voltages of the two input terminals In1 and In2 to the bias voltage Vbias ((B) of FIG. 13) and the detection current Idet and the reference current Iref flow. Thus, the voltage of the output signal SAout of the sense amplifier 40 slowly rises as time goes on ((C) of FIG. 13).

Then, at a timing t22, the voltage of the signal SAout sufficiently rises and the output signal Cout of the comparator 33 reaches the high level ((D) of FIG. 13). Thus, also the output signal Dout of the latch circuit 39 reaches the high level ((E) of FIG. 13).

Then, at a timing t23, the read control signal generation section 35 makes the read control signal Sread transit from the high level to the low level ((A) of FIG. 13). Thus, the sense amplifier 40 sets the voltages of the two input terminal In1 and In2 to the voltage Vss as in the period before the timing t21 ((B) of FIG. 13) to stop application of the bias voltage Vbias to the memory device 21. Then, at the timing t23, the switch 38 enters the ON state and the voltage of the output terminal Out (the signal SAout) of the sense amplifier 40 is set to the reference voltage Vref ((C) of FIG. 13). In addition, since at the timing t23, the voltage (the read control signal Sread) of the input terminal E has transited to the low level, the latch circuit 39 retains the signal Dout (the high level) obtained directly before the timing t23 and keeps outputting the high level signal Dout thereafter.

Figure 14:
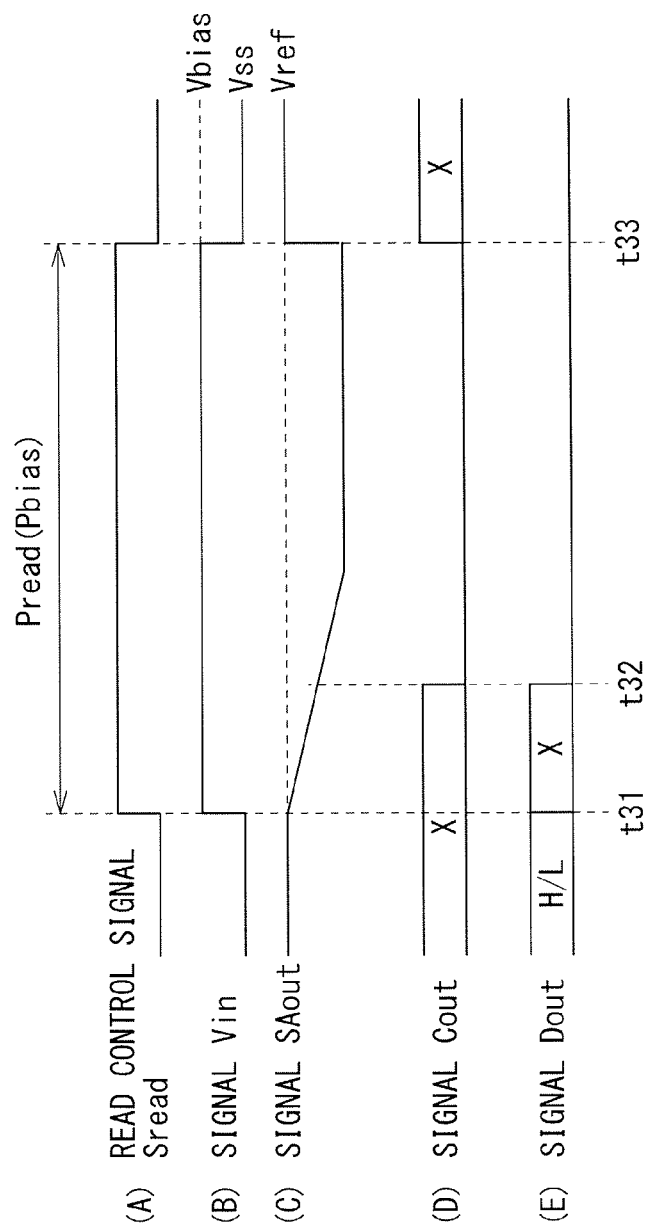
FIG. 14 is a timing waveform chart illustrating another operational example of the read section illustrated in FIG. 12.

FIG. 14 illustrates a timing chart of one example of the operation of reading the resistance data in the memory device 21 when the resistance state of the memory device 21 is the low resistance state LRS, in which (A) indicates a waveform of the read control signal Sread, (B) indicates a waveform of the signal Vin, (C) indicates a waveform of the signal SAout, (D) indicates a waveform of the signal Cout, and (E) indicates a waveform of the signal Dout.

First, at a timing t31, the read control signal generation section 35 makes the read control signal Sread transit from the low level to the high level ((A) of FIG. 14). Thus, the sense amplifier 40 sets the voltages of the two input terminals In1 and In2 to the bias voltage Vbias ((B) of FIG. 14) and the detection current Idet and the reference current Iref flow. Thus, the voltage of the output signal SAout of the sense amplifier 40 rather rapidly drops in this example as time goes on ((D) of FIG. 14).

Then, at a timing t32, the voltage of the signal SAout sufficiently drops and the output signal Cout of the comparator 33 reaches the low level ((D) of FIG. 14). Thus, also the output signal Dout of the latch circuit 39 reaches the low level ((E) of FIG. 14). The voltage of the signal SAout still keeps on dropping thereafter, reaches a lower limit of an operating voltage range and thereafter is maintained at this voltage.

Then, at a timing t33, the read control signal generation section 35 makes the read control signal Sread transit from the high level to the low level ((A) of FIG. 14). Thus, the sense amplifier 40 sets the voltages of the two input terminal In1 and In2 to the voltage Vss as in the period before the timing t31 ((B) of FIG. 14) and stops application of the bias voltage Vbias to the memory device 21. Then, at the timing t33, the switch 38 enters the ON state and the voltage of the output terminal Out (the signal SAout) of the sense amplifier 40 is set to the reference voltage Vref ((C) of FIG. 14). In addition, since at the timing t33, the voltage (the read control signal Sread) of the input terminal E has transited to the low level, the latch circuit 39 retains the signal Dout (the low level) obtained directly before the timing t33 and keeps outputting the low level signal Dout thereafter.

As described above, since in the read section 30BR according to the comparative example, the voltage of the sense amplifier 40 is set to the reference voltage Vref prior to the read period Pread, and the operation of the sense amplifier 40 is controlled on the basis of the read control signal Sread, the read disturb may possibly be liable to occur. That is, as illustrated in FIGS. 13 and 14, the bias voltage Vbias is applied to the memory device 21 on a consistent basis in the read period Pread regardless of the resistance state (the high resistance state HRS or the low resistance state LRS) of the memory device 21. Thus, the integrated time is rapidly increased and the read disturb may possibly occur.

In contrast, in the read section 30B according to the present embodiment, the voltage of the signal SAout is set to the precharge voltage Vpre which is higher than the reference voltage Vref prior to the read period Pread. Also, the control signal SE is generated on the basis of the output signal Cout from the comparator 33, and the operation of the sense amplifier 40 is controlled on the basis of this control signal SE. Thus, it is possible to stop application of the bias voltage Vbias to the memory device 21 after it has been detected that the resistance state of the memory device 21 is the low resistance state LRS. That is, the bias voltage Vbias is applied to the memory device 21 only for a period necessary for detection of the resistance state of the memory device 21. Therefore, it is possible to make the read disturb difficult to occur by reducing the bias voltage application period Pbias without adversely affecting the data reading operation.

In addition, since in the read section 30B according to the present embodiment, the voltage of the signal SAout is set to the precharge voltage Vpre which is higher than the reference voltage Vref prior to the read period Pread, it is possible to perform the data reading operation more stably. That is, for example, when the voltage of the signal SAout is set to the reference voltage Vref prior to the read period Pread, the comparator 33 may output the signal Cout of, for example, an intermediate level or the like directly after the read period Pread has been started as in the case of the comparative example. Therefore, since also the control signal SE reaches an unstable level and also the operation of the sense amplifier 40 or the like becomes unstable, the data reading operation may possibly become unstable. In contrast, in the read section 30B, since the voltage of the signal SAout is set to the precharge voltage Vpre, it is possible to set the output signal Cout from the comparator 33 to the stable level (the high level) directly after the read period Pread has been started, and it is possible to perform the data reading operation more stably.

In addition, in the read section 30B according to the present embodiment, the bias voltage application period Pbias is reduced in a case where the voltage of the signal SAout is rapidly changed in the bias voltage application period Pbias (in this example, the case that the resistance state of the memory device 21 is the low resistance state LRS (FIG. 7)). That is, supposing that the bias voltage application period Pbias is reduced in a case where the voltage of the signal SAout is slowly changed (in this example, the case that the resistance of the memory device 21 is the high resistance state HRS (FIG. 6)), it would be difficult to reduce the bias voltage application period Pbias so much, and therefore the effect of making the read disturb difficult to occur may possibly be weakened slightly. In contrast, since in the read section 30B, the bias voltage application period Pbias is reduced in such a case that the voltage of the signal SAout is rapidly changed, it is possible to even more reduce the bias voltage application period Pbias, and it is therefore possible to further reduce the integrated time and to make the read disturb difficult to occur.

In addition, it is preferable that embodiments of the present disclosure be applied also to, for example, a case that readiness in occurrence of the read disturb is different between the high resistance state HRS and the low resistance state LRS. That is, for example, when the memory device 21 is a memory device that the read disturb occurs more readily in the low resistance state LRS than in the high resistance state HRS, using the read section 30B makes it possible to reduce the integrated time in the low resistance state LRS even more, and to reduce the possibility of occurrence of the read disturb.

[Effects]

As described above, in the present embodiment, the control signal is generated on the basis of the output signal from the comparator, and the operation of the sense amplifier is controlled on the basis of this control signal. Therefore, it is possible to stop application of the bias voltage to the memory device after it has been detected that the resistance state of the memory device is the low resistance state. Hence, it is possible to make the read disturb difficult to occur.

In addition, in the present embodiment, the voltage of the positive input terminal of the comparator is set to the precharge voltage which is different from the reference voltage by the offset voltage prior to the read period. Therefore, it is possible to perform the data reading operation more stably, and to improve the throughput of the data reading operation.

Modification Example 1-1

In the above-mentioned embodiment, the sense amplifier 40 is not limited to the configuration illustrated in FIG. 5. In the following, several examples thereof will be described in detail.

Figure 15:
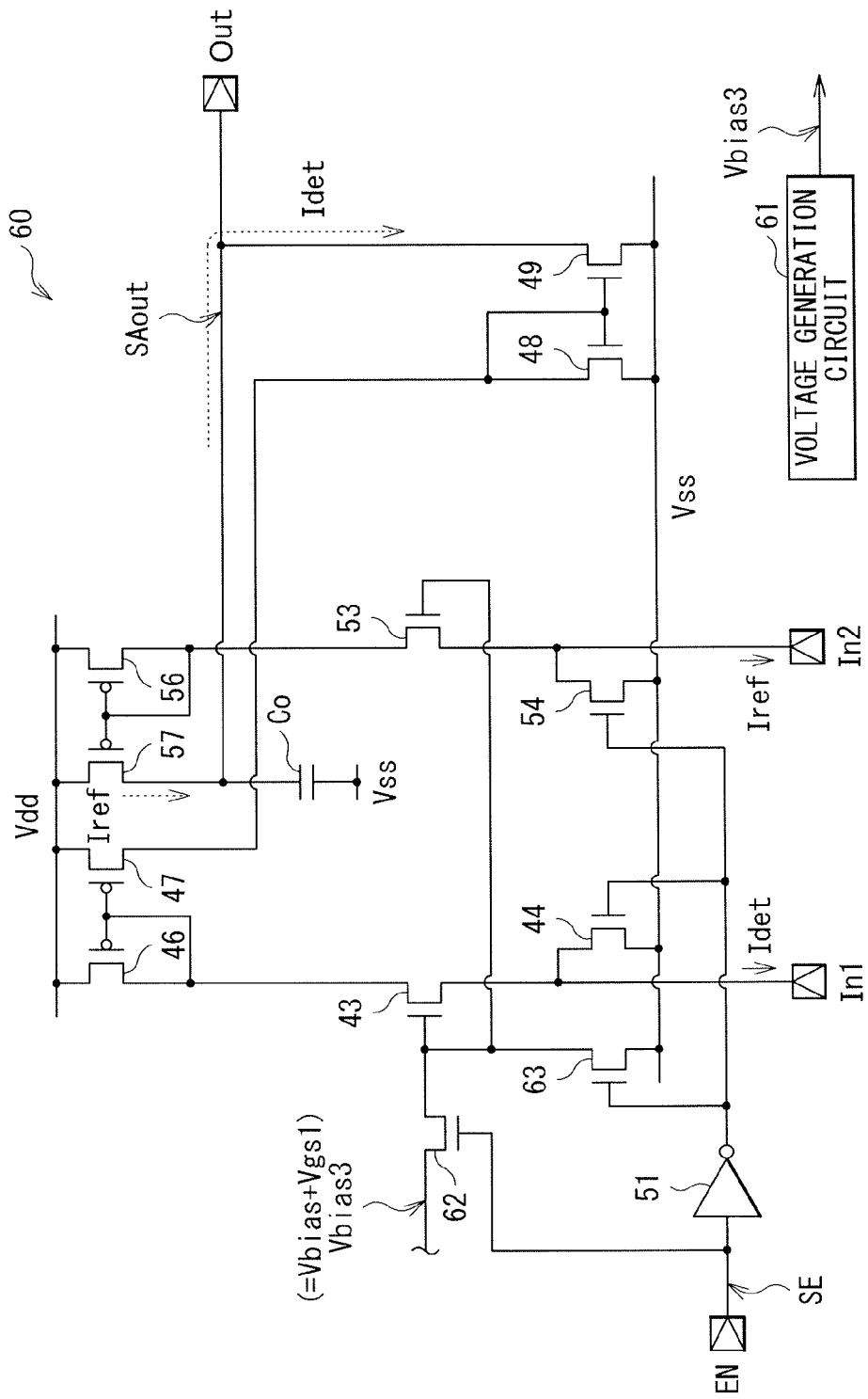
FIG. 15 is a circuit diagram illustrating one configuration example of a sense amplifier according to one modification example.

FIG. 15 illustrates one configuration example of a sense amplifier 60 according to the present modification example. The sense amplifier 60 includes a voltage generation circuit 61, and transistors 62 and 63. The transistors 62 and 63 are provided in place of the operational amplifiers 42 and 52 and the transistors 45 and 55 in the sense amplifier 40 (FIG. 5) according to the above-mentioned embodiment.

The voltage generation circuit 61 is a circuit for generating a voltage Vbias3. This voltage Vbias3 is a voltage (Vbias3=Vbias+Vgsl) which is the sum of the bias voltage Vbias applied to the memory device 21 in the data reading operation and a gate-to-source voltage Vgsl of the transistor 53 when the reference current Iref has flown. The transistors 62 and 63 are N-type MOS transistors. A drain of the transistor 62 is connected to the gate of the transistor 43 and the gate of the transistor 53 and so forth, a gate thereof is connected to an enable terminal EN of the sense amplifier 60, and the voltage Vbias3 is supplied to a source thereof. A drain of the transistor 63 is connected to the gate of the transistor 43 and the gate of the transistor 53 and so forth, a gate thereof is connected to the output terminal of the inverter 51 and so forth, and the voltage Vss is supplied to a source thereof.

Owing to this configuration, in the sense amplifier 60, when the control signal SE is at the high level (active), the transistor 62 enters the ON state and the voltage Vbias3 is supplied to the gates of the transistors 43 and 53. Thus, a voltage (Vbias3−Vth=Vbias) which is lower than the voltage Vbias3 by a threshold voltage Vth of the transistors 43 and 53 is generated in the sources of the transistors 43 and 53. That is, owing to such a source follower configuration, it is possible to set the voltages of the input terminals In1 and In2. It is possible to achieve effects which are the same as those by the above-mentioned embodiment even by such a simple configuration as mentioned above.

Figure 16:
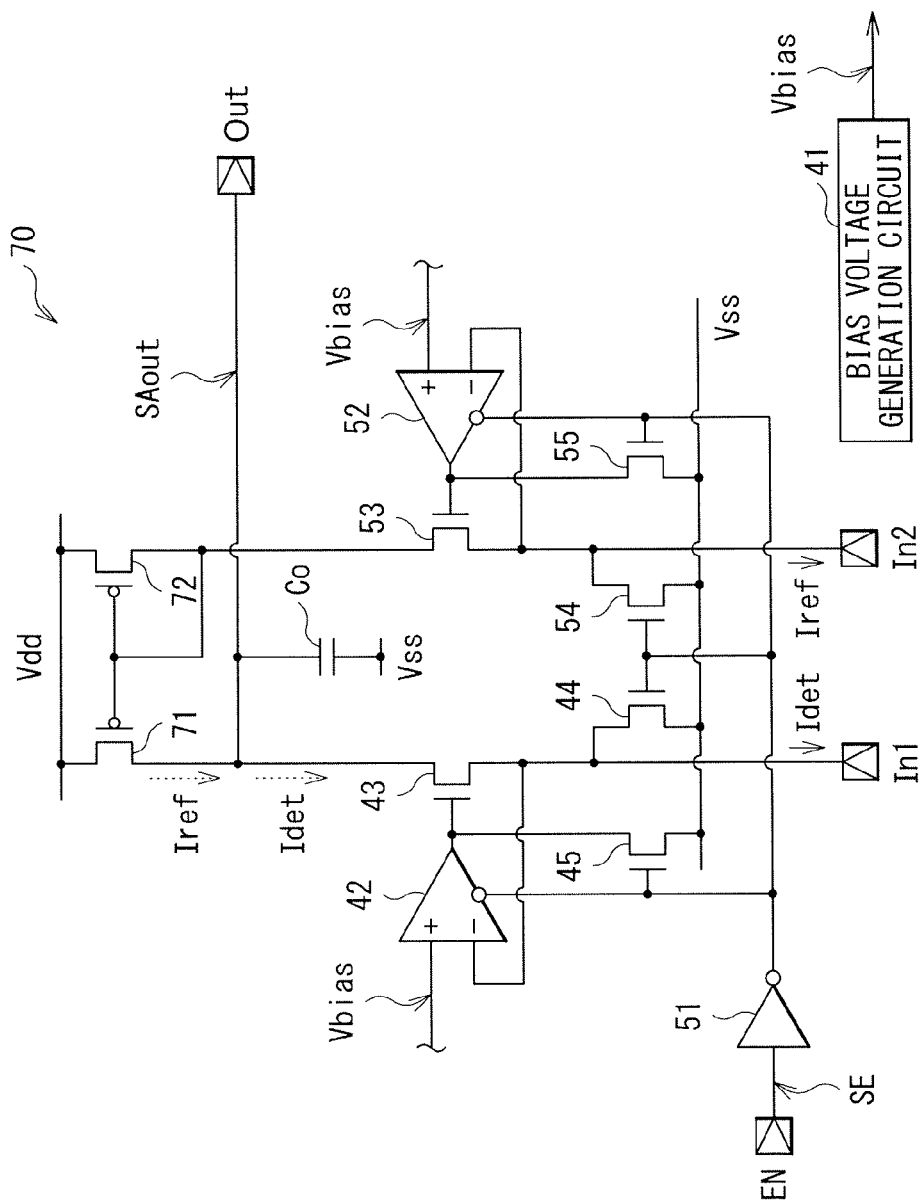
FIG. 16 is a circuit diagram illustrating one configuration example of a sense amplifier according to another modification example.

FIG. 16 illustrates one configuration example of a sense amplifier 70 according to another modification example. The sense amplifier 70 includes transistors 71 and 72. The transistors 71 and 72 are P-type MOS transistors. The transistors 71 and 72 are provided in place of the transistors 46 to 49, 56, and 57 in the sense amplifier 40 (FIG. 5) according to the above-mentioned embodiment.

A drain of the transistor 71 is connected to the drain of the transistor 43, the one end of the capacitor Co, and an output terminal Out of the sense amplifier 70, a gate thereof is connected to a drain and a gate of the transistor 72 and so forth, and the voltage Vdd is supplied to a source thereof. The drain of the transistor 72 is connected to the drain of the transistor 53 and the gate of the transistor 71 and so forth, and the voltage Vdd is supplied to a source thereof. In this example, the dimensions (the gate width W and the gate length L) of the transistor 71 and the transistor 72 are the same as each other. Owing to this configuration, the transistors 71 and 72 configure the so-called current mirror circuit.

Owing to this configuration, in the sense amplifier 70, the voltages of the input terminals In1 and In2 are set to the bias voltage Vbias when the control signal SE is at the high level (active). Thus, the detection current Idet flows from the transistor 43 toward the input terminal In1, and the reference current Iref flows in order of the transistor 72, the transistor 53, and the input terminal In2. A current which is equal to the reference current Iref flows through the transistor 71 by the current mirror circuit configured by the transistors 71 and 72. Therefore, a current corresponding to a difference (Iref−Idet) between the reference current Iref and the detection current Idet flows into the one end of the capacitor Co and the voltage (the signal SAout) at the one end of the capacitor Co is changed. It is possible to achieve effects which are the same as those by the above-mentioned embodiment even by such a simple configuration as mentioned above.

In addition, the configuration in FIG. 15 may be combined with the configuration in FIG. 16.

Modification Example 1-2

Although in the above-mentioned embodiment, the bias voltage Vbias is applied to the memory device 21, and the data reading operation is performed on the basis of the current generated in the memory device 21 with that bias voltage Vbias, the present disclosure is not limited thereto. Alternatively, for example, a predetermined current may be made to flow through the memory device 21 so as to perform the data reading operation on the basis of the voltage generated in the memory device 21 with that current. In the following, a sense amplifier 80 according to the present modification example will be described in detail.

Figure 17:
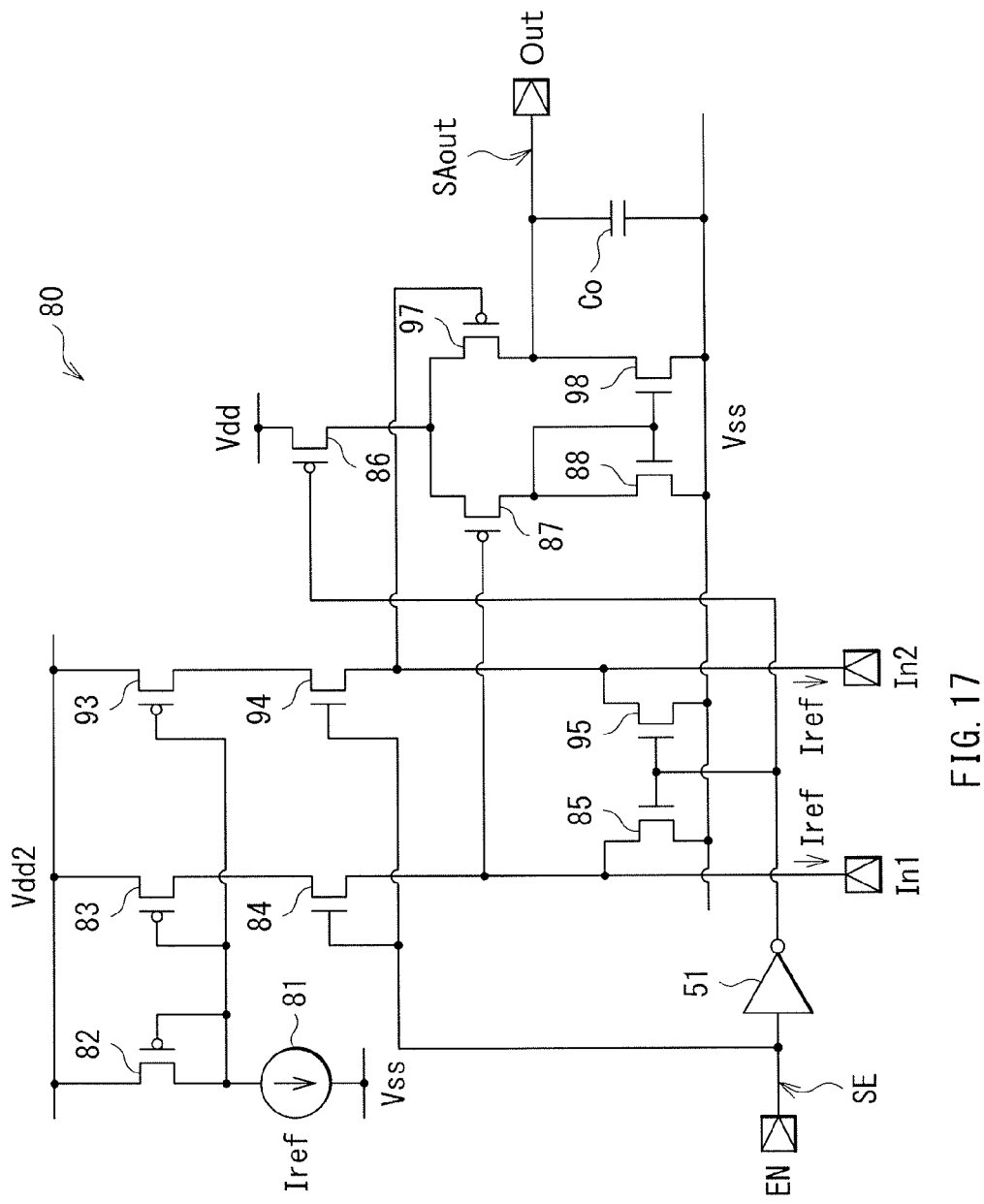
FIG. 17 is a circuit diagram illustrating one configuration example of a sense amplifier according to a further modification example.

FIG. 17 illustrates one configuration example of the sense amplifier 80. The sense amplifier 80 includes a reference current source 81, transistors 82 to 88, 93 to 95, 97, and 98. The transistors 84, 85, 88, 94, 95, and 98 are N-type MOS transistors, and the transistors 82, 83, 86, 87, 93, and 97 are P-type MOS transistors.

The reference current source 81 generates the reference current Iref, a drain of the transistor 82 or the like is connected to one end thereof and the voltage Vss is supplied to the other end thereof. The drain of the transistor 82 is connected to the one end of the reference current source 81 and a gate of the transistor 82 and so forth, and a voltage Vdd2 is supplied to a source thereof.

A drain of the transistor 83 is connected to a drain of the transistor 84, a gate thereof is connected to the gate of the transistor 82 and so forth, and the voltage Vdd2 is supplied to a source thereof. In this example, the dimensions (the gate width W and the gate length L) of the transistors 82 and 83 are the same as each other. Owing to this configuration, the transistors 82 and 83 configure the so-called current mirror circuit. The drain of the transistor 84 is connected to the drain of the transistor 83, a gate thereof is connected to an enable terminal EN of the sense amplifier 80, and a source thereof is connected to the input terminal In1 and a gate of the transistor 87 and so forth. A drain of the transistor 85 is connected to the input terminal In1 and so forth, a gate thereof is connected to the output terminal of the inverter 51, and the voltage Vss is supplied to a source thereof.

Connection of each of the transistors 93 to 95 is the same as connection of each of the above-mentioned transistors 83 to 85.

A drain of the transistor 86 is connected to a source of the transistor 87 and a source of the transistor 97, a gate thereof is connected to the output terminal of the inverter 51, and the voltage Vdd is supplied to a source thereof. A drain of the transistor 87 is connected to a drain and a gate of the transistor 88 and so forth, the gate thereof is connected to the input terminal In1 and so forth, and the source thereof is connected to the drain of the transistor 86 and so forth. The drain of the transistor 88 is connected to the gate of the transistor 88 and the drain of the transistor 87, and the voltage Vss is supplied to a source thereof. A drain of the transistor 97 is connected to a drain of the transistor 98 and the one end of the capacitor Co, a gate thereof is connected to the input terminal In2, and the source thereof is connected to the drain of the transistor 86 and so forth. The drain of the transistor 98 is connected to the drain of the transistor 97 and the output terminal Out, a gate thereof is connected to the gate of the transistor 88 and so forth, and the voltage Vss is supplied to a source thereof. The transistors 86 to 88, 97, and 98 configure an amplifier circuit.

Owing to this configuration, in the sense amplifier 80, a current which is equal to the reference current Iref that the reference current source 81 has generated flows in order of the transistor 83, the transistor 84, the input terminal In1, the column switch 13, and the memory device 21, and flows in order of the transistor 93, the transistor 94, the input terminal In2, and the reference memory cell 29 when the control signal SE is at the high level (active). Thus, a voltage according to the resistance value R of the memory device 21 is generated at the input terminal In1, and a voltage according to the resistance value of the memory device of the reference memory cell 29 is generated at the input terminal In2. Then, the amplifier circuit configured by the transistors 86 to 88, 97, and 98 generates the signal SAout on the basis of a difference between the voltage generated at the input terminal In1 and the voltage generated at the input terminal In2. It is possible to achieve effects which are same as those by the above-mentioned embodiment even by such a configuration as mentioned above.

Modification Example 1-3

Although in the above-mentioned embodiment, the bias voltage application period Pbias when the resistance state of the memory device 21 is the low resistance state LRS is reduced, the present disclosure is not limited thereto. Alternatively, the bias voltage application period Pbias when the resistance state is the high resistance state HRS may be reduced. In the following, the present modification example will be described in detail.

Figure 18:
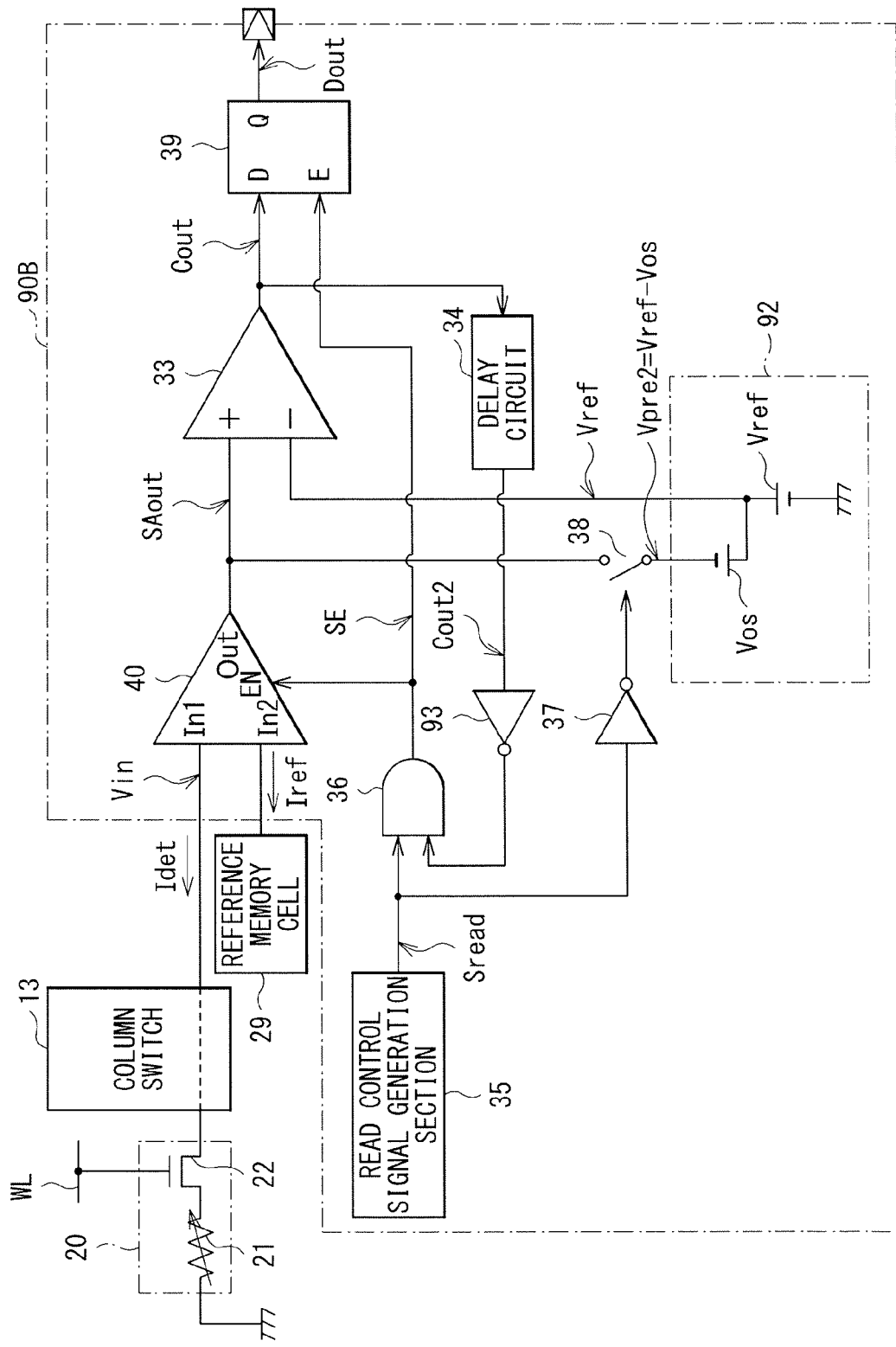
FIG. 18 is a block diagram illustrating one configuration example of a read section according to a still further modification example.

FIG. 18 illustrates one configuration example of a read section 90B according to the present modification example. The read section 90B includes a voltage generation section 92 and an inverter 93. The voltage generation section 92 generates the reference voltage Vref and a precharge voltage Vpre2. The precharge voltage Vpre2 is a voltage (Vref−Vos) that the offset voltage Vos has been subtracted from the reference voltage Vref. The inverter 93 is a circuit for logically inverting an output signal Cout2 from the delay circuit 34 and supplying an inverted signal thereof to the AND circuit 36.

Figure 19:
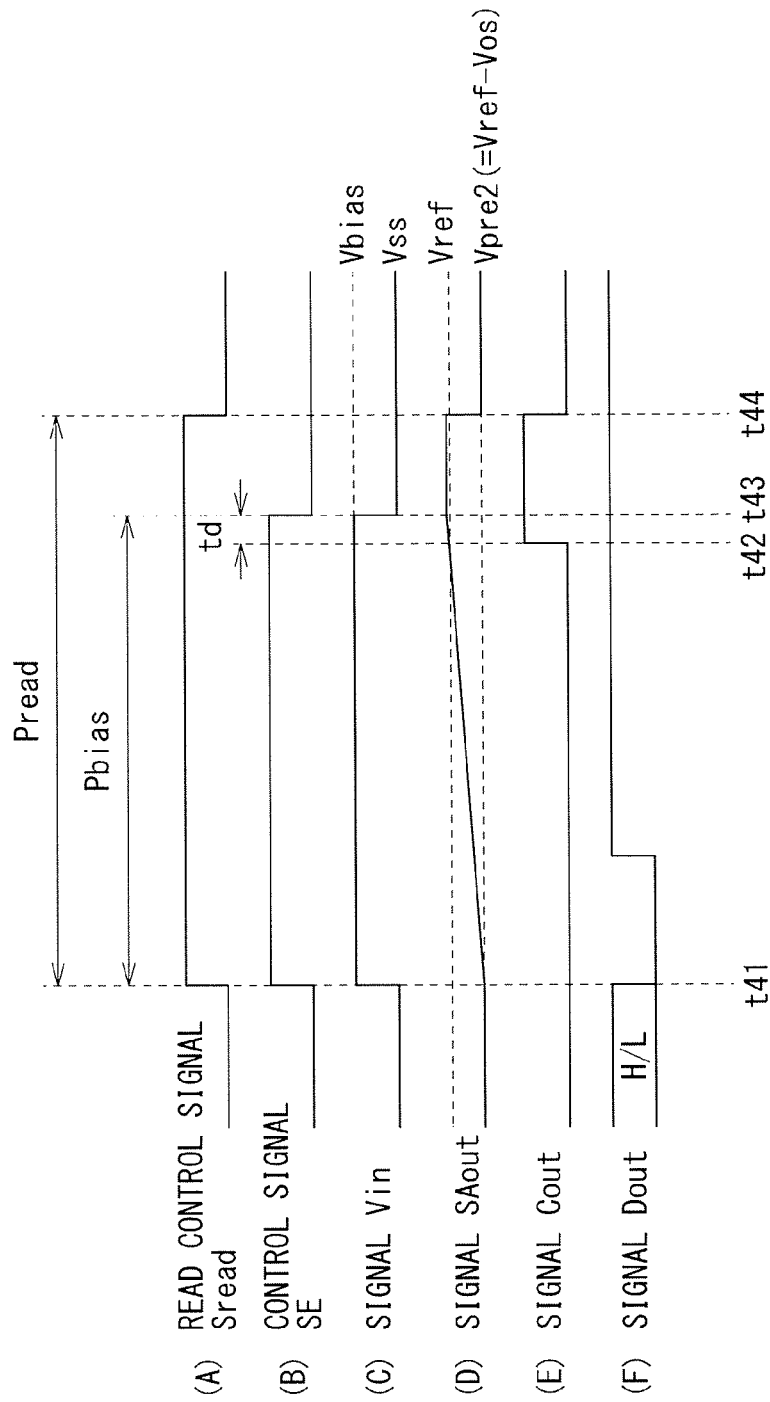
FIG. 19 is a timing waveform chart illustrating one operational example of the read section illustrated in FIG. 18.
Figure 20:
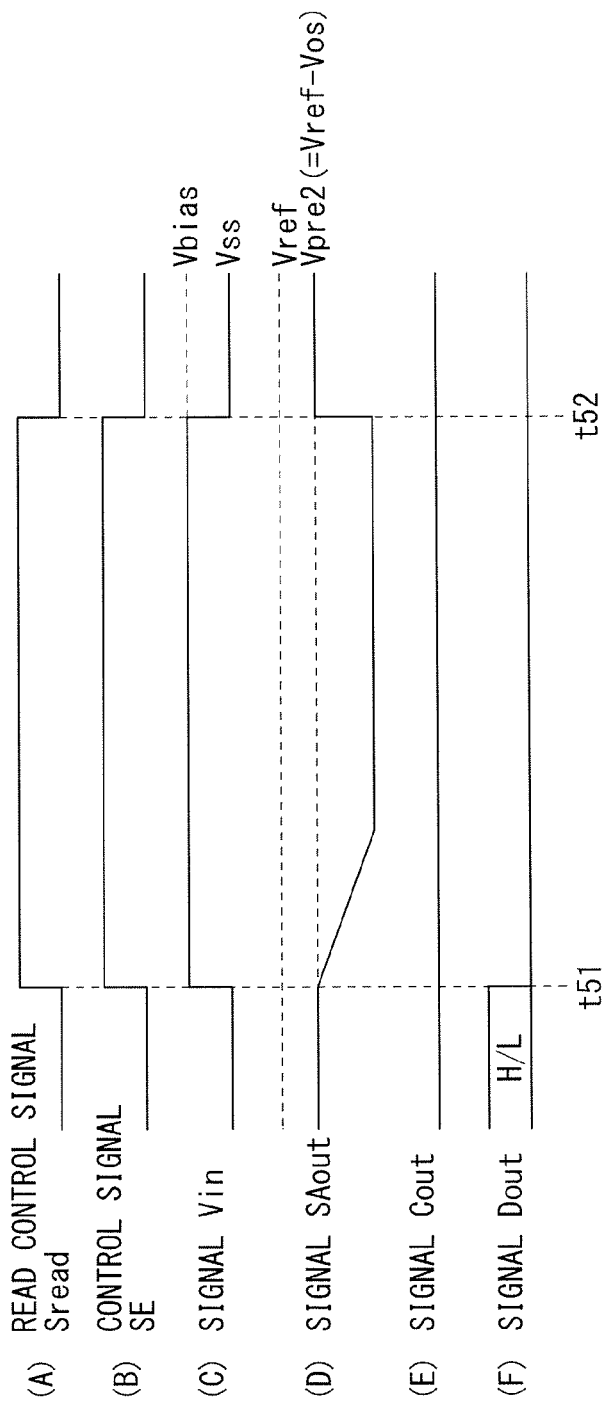
FIG. 20 is a timing waveform chart illustrating another operational example of the read section illustrated in FIG. 18.

FIGS. 19 and 20 illustrate timing charts of examples of the operation of reading the resistance data in the memory device 21. FIG. 19 indicates the case that the resistance state of the memory device 21 is the high resistance state HRS, and FIG. 20 indicates the case that the resistance state of the memory device 21 is the low resistance state LRS. When the resistance state of the memory device 21 is the high resistance state HRS, the read section 90B according to the present modification example starts application of the bias voltage Vbias to the memory device 21 at a timing t41 and stops application of this bias voltage Vbias at a timing t43 which is within the read period Pread as illustrated in FIG. 19.

It is also possible to make the read disturb difficult to occur even by such a configuration as mentioned above. That is, since the resistance value R of the memory device 21 is varied in general, it is desired for the read section 90B to ensure that the data reading operation is performed no matter how the resistance value R thereof is varied. In this example, since the smaller the resistance value R is, the more slowly the signal SAout is changed in the read period Pread in the high resistance state HRS, it is desirable to set the read period Pread to a sufficiently long time so as to normally perform the data reading operation under a condition that the resistance value R is minimized. That is, the length of the read period Pread is so set that the data reading operation is performable normally even under a condition that the resistance value R is varied to a minimum value in the high resistance state HRS. On the other hand, the read period Pread which has been set as mentioned above may be too long for an individual that, for example, the resistance value R has been varied to a maximum value in the high resistance state HRS. Therefore, when the resistance state of the memory device 21 is the high resistance state HRS as in the present modification example, it is possible to make the read disturb difficult to occur by reducing the bias voltage application period Pbias in accordance with the resistance value R.

In addition, for example, when the memory device 21 is a memory device of the type that the read disturb is more liable to occur in the high resistance state HRS than in the low resistance state LRS, using the read section 90B makes it possible to reduce the integrated time in the high resistance state HRS, and to reduce the possibility of occurrence of the read disturb.

Modification Example 1-4

Figure 21:
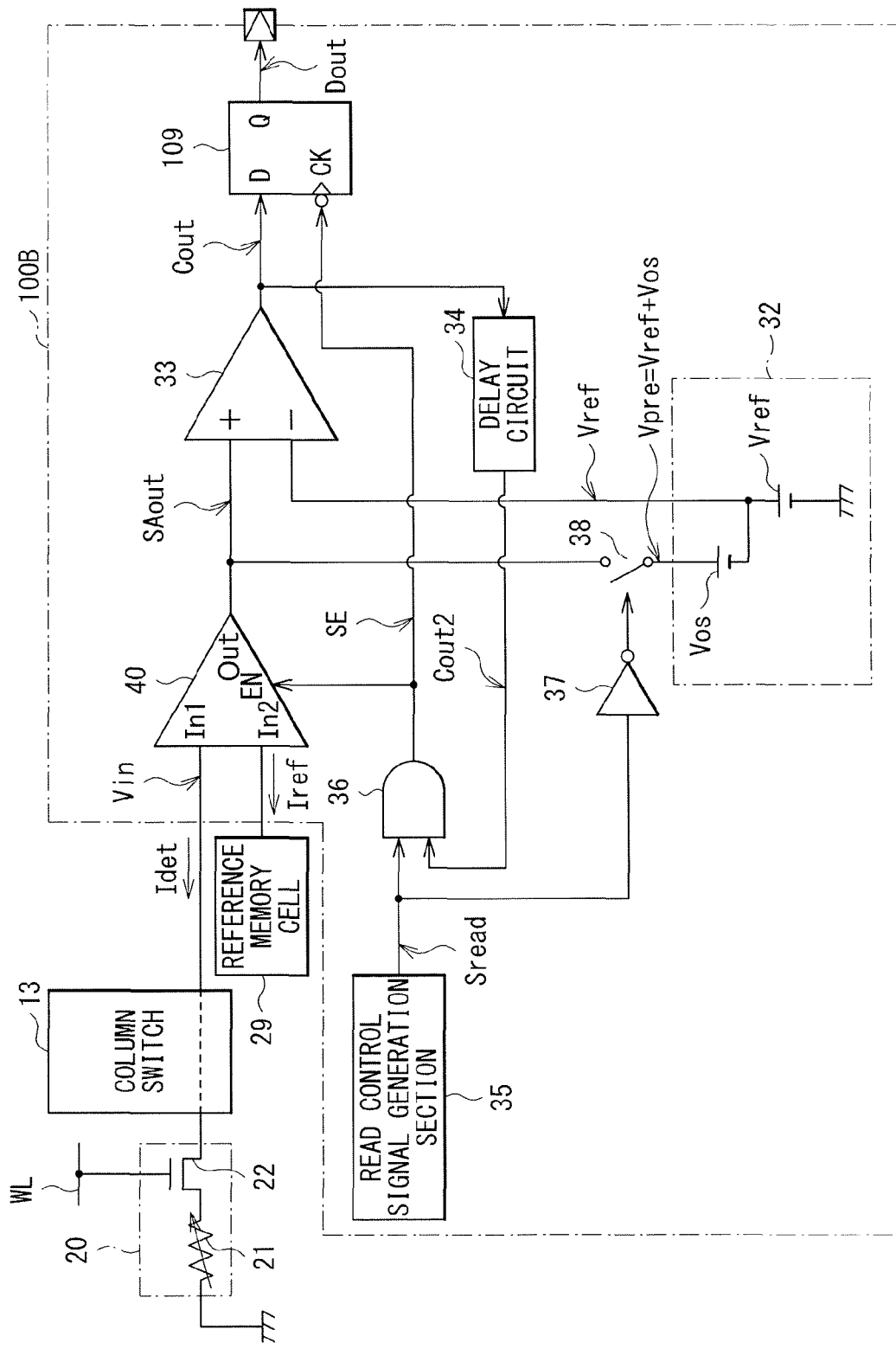
FIG. 21 is a block diagram illustrating one configuration example of a read section according to a still further modification example.

Although in the above-mentioned embodiment, the latch circuit 39 is provided in the read section 30B, the present disclosure is not limited thereto. Alternatively, a flop-flop circuit may be provided in place of the latch circuit 39, for example, as illustrated in FIG. 21. A read section 100B according to the present modification example includes a flip-flop circuit 109. The flip-flop circuit 109 is an edge trigger type circuit and includes a negative logic input terminal CK. The input terminal CK is connected to the output terminal of the AND circuit 36 and so forth and the control signal SE is supplied thereto. The flip-flop circuit 109 samples the signal Cout upon rising of the control signal SE and outputs the sampled signal Cout as the signal Dout. It is possible to achieve effects which are the same as those by the above-mentioned embodiment even by such a configuration as mentioned above.

Modification Example 1-5

Although in the above-mentioned embodiment, the referenced memory cell 29 is provided in the memory cell array 10, the present disclosure is not limited thereto. Alternatively, for example, the reference memory cell 29 may be provided separately from the memory cell array 10. Specifically, the reference memory cell 29 may be provided in the read section 30 and/or may be provided near the read section 30 separately from the memory cell array 10. In the above-mentioned cases, the reference memory cell 29 may be configured in the same manner as the memory cell 20, or may be configured differently (for example, a polysilicon resistor, a MOS transistor, a diffused resistor, and so forth). In addition, the reference memory cell 29 may be configured as a current source for letting the reference current Iref flow.

Although the present disclosure has been described by giving some embodiments and the modification examples, the present disclosure is not limited to these embodiments and modification examples, and may be modified in a variety of ways.

For example, the memory device 21 is not limited to the configuration illustrated in FIG. 2 and so forth, and may have any another configuration. Specifically, the memory device may be, for example, a phase change type memory device, a resistance change type device and so forth made of a transition metal oxide and so forth. In addition, the memory device may be an MTJ (Magnetic Tunnel Junction) used in an MRAM (Magneto-resistive Random Access Memory) and so forth for storing information with a magnetic field and by spin injection.

Furthermore, the technology encompasses any possible combination of some or all of the various embodiments described herein and incorporated herein.

It is possible to achieve at least the following configurations from the above-described example embodiments of the disclosure.

(1) A semiconductor device, including:
   a memory device configured to take a plurality of resistance states that are distinguishable from one another;
   a bias application section configured to apply, in a bias application period, a bias signal to the memory device; and
   a determination section configured to determine a resistance state of the memory device on the basis of a detection signal, the detection signal being generated in the memory device to which the bias signal is applied, wherein
   the bias application section sets a length of the bias application period in accordance with a resistance value of the memory device, when the resistance state determined by the determination section is predetermined one of the resistance states.

(2) The semiconductor device according to (1), wherein the determination section includes:
   a sense amplifier configured to generate a first signal on the basis of the detection signal, the first signal having a voltage that changes, in the bias application period, in a voltage direction according to the resistance state of the memory device and at a speed according to the resistance value of the memory device; and
   a comparator configured to generate a second signal by comparing the voltage of the first signal with a reference voltage, the second signal indicating the resistance state of the memory device.
(3) The semiconductor device according to (2), further including a signal generation section configured to generate a read control signal,
wherein the bias application section includes:
a pulse signal generation circuit configured to generate a pulse signal, a pulse period of the pulse signal being a period from a timing at which the read control signal has become active to a timing that is synchronized with a timing at which the second signal has changed; and
an application circuit configured to selectively apply the bias signal to the memory device on the basis of the pulse signal.
(4) The semiconductor device according to (3), wherein the determination section further includes a precharge circuit configured to set, in a preparation period that precedes the pulse period, the voltage of the first signal to a precharge voltage that is different from the reference voltage.
(5) The semiconductor device according to (4), wherein
the plurality of resistance states are two resistance states including a high resistance state and a low resistance state, and
the precharge voltage is a voltage that is deviated, from the reference voltage, in the voltage direction in which the first signal changes when the memory device is in the high resistance state.
(6) The semiconductor device according to (5), wherein the memory device causes a read disturb more readily in the low resistance state than in the high resistance state.
(7) The semiconductor device according to (4), wherein
the plurality of resistance states are two resistance states including a high resistance state and a low resistance state, and
the precharge voltage is a voltage that is deviated, from the reference voltage, in the voltage direction in which the first signal changes when the memory device is in the low resistance state.
(8) The semiconductor device according to any one of (4) to (7), wherein the precharge circuit sets the voltage of the first signal on the basis of the read control signal.
(9) The semiconductor device according to any one of (3) to (8), wherein
the bias application section further includes a delay circuit configured to delay the second signal, and
the pulse period is the period up to a timing at which the delayed second signal has changed.
(10) The semiconductor device according to any one of (3) to (9), wherein the determination section further includes a latch circuit configured to output, as an output signal, the second signal in the pulse period, and to hold the output signal in a period other than the pulse period.
(11) The semiconductor device according to any one of (3) to (9), wherein the determination section further includes a flip-flop circuit configured to sample the second signal at an end timing of the pulse period, to hold a result of the sampling, and to output the result of the sampling.
(12) The semiconductor device according to any one of (1) to (11), wherein the bias signal is a voltage signal, and the detection signal is a current signal.
(13) The semiconductor device according to any one of (1) to (11), wherein the bias signal is a current signal, and the detection signal is a voltage signal.
(14) The semiconductor device according to (1), wherein the memory device includes two terminals, and stores information by utilizing a reversible change in the resistance states in accordance with a polarity of a difference in potential applied across the two terminals.
(15) The semiconductor device according to (1), wherein
the memory device includes a memory layer in which an ion source layer and a resistance change layer are laminated, and
the ion source layer contains one or more chalcogen elements selected from a group of tellurium, sulfur, and selenium, and a positively-ionizable metal element.
(16) An information reading method, including:
applying, in a bias application period, a bias signal to a memory device configured to take a plurality of resistance states that are distinguishable from one another;
determining a resistance state of the memory device on the basis of a detection signal, the detection signal being generated in the memory device to which the bias signal is applied; and
setting a length of the bias application period in accordance with a resistance value of the memory device, when the determined resistance state is predetermined one of the resistance states.

It should be understood by those skilled in the art that various modifications, combinations, sub-combinations and alterations may occur depending on design requirements and other factors insofar as they are within the scope of the appended claims or the equivalents thereof.

What is claimed is:
1. A memory device, comprising:
a plurality of memory cells, each of the memory cells configured to output a voltage signal as a detection signal and including a first electrode, a memory layer, and a second electrode;
a reference memory cell, the reference memory cell configured to output a reference voltage;
a bias application section configured to provide a bias signal which is applied to one of the electrodes of the memory cells and, for each memory cell, generate the detection signal;
a determination section in electrical communication with the memory cells and configured to compare each detection signal with the reference voltage and output a respective result; and
a signal generation section configured to generate a read control signal that is used to control operation of the determination section,
wherein,
the bias application section includes a pulse signal generation circuit configured to generate a pulse signal and an application circuit configured to selectively apply the bias signal to the memory cells based on the pulse signal.
2. The memory device according to claim 1, wherein each memory layer is configured to selectively assume each of a plurality of resistance states that are distinguishable from one another.
3. The memory device according to claim 1, wherein the bias application section is configured to apply, in a bias application period, a bias signal via a bit line to the memory cells.
4. The memory device according to claim 3, wherein:
the determination section is configured to determine a resistance state of the memory layer of each memory cell based on its detection signal, and
the bias application section sets a length of the bias application period in accordance with a resistance value of the memory layer when the resistance state deter- mined by the determination section is one of the plurality of the resistance states.

5. The memory device according to claim 1, wherein the determination section includes:
   a sense amplifier configured to generate a respective first signal based on each detection signal, the first signal having a voltage that changes, in the bias application period, in a voltage direction according to the resistance state of the memory layer and at a speed according to the resistance value of the respective memory layer; and
   a comparator configured to generate a second signal by comparing the voltage of the first signal with the reference voltage, the second signal indicating the resistance state of the respective memory layer of the memory device.

6. The memory device according to claim 5, wherein the a pulse period of the pulse signal is a period from a timing at which the read control signal has become active to a timing that is synchronized with a timing at which the second signal has changed.

7. The memory device according to claim 6, wherein the determination section further includes a precharge circuit configured to set, in a preparation period that precedes the pulse period, the voltage of the first signal to a precharge voltage that is different from the reference voltage.

8. The memory device according to claim 7, wherein the plurality of resistance states are two resistance states including a high resistance state and a low resistance state, and the precharge voltage is a voltage that is deviated, from the reference voltage, in the voltage direction in which the first signal changes when the respective memory layer is in the high resistance state.

9. The memory device according to claim 8, wherein some of the memory cells cause a read disturb more readily in the low resistance state than in the high resistance state.

10. The memory device according to claim 7, wherein the plurality of resistance states are two resistance states including a high resistance state and a low resistance state, and the precharge voltage is a voltage that is deviated, from the reference voltage, in the voltage direction in which the first signal changes when the respective memory layer is in the low resistance state.

11. The memory device according to claim 7, wherein the precharge circuit sets the voltage of the first signal based on the read control signal.

12. The memory device according to claim 6, wherein the bias application section further includes a delay circuit configured to delay the second signal, and the pulse period is the period up to a timing at which the delayed second signal has changed.

13. The memory device according to claim 6, wherein the determination section further includes a latch circuit configured to output, as an output signal, the second signal in the pulse period, and to hold the output signal in a period other than the pulse period.

14. The memory device according to claim 6, wherein the determination section further includes a flip-flop circuit configured to sample the second signal at an end timing of the pulse period, to hold a result of the sampling, and to output the result of the sampling.

15. The memory device according to claim 3, wherein the bias signal is a voltage signal.

16. The memory device according to claim 3, wherein the bias signal is a current signal.

17. The memory device according to claim 1, wherein each of the memory cells stores information by utilizing a reversible change in the plurality of resistance states in accordance with a polarity of a difference in potential applied across the first and the second electrodes.

18. The memory device according to claim 1, wherein: the memory layer of each memory device includes an ion source layer and a resistance change layer are laminated, and the ion source layer contains one or more chalcogen elements selected from a group of tellurium, sulfur, and selenium, and a positively-ionizable metal element.

* * * * *